United States Patent
Stark

(10) Patent No.: US 6,646,953 B1
(45) Date of Patent: Nov. 11, 2003

(54) SINGLE-CLOCK, STROBELESS SIGNALING SYSTEM

(75) Inventor: Donald C. Stark, Los Altos Hills, CA (US)

(73) Assignee: Rambus Inc., Los Altos, CA (US)

(*) Notice: Subject to any disclaimer, the term of this patent is extended or adjusted under 35 U.S.C. 154(b) by 0 days.

(21) Appl. No.: 09/611,936

(22) Filed: Jul. 6, 2000

(51) Int. Cl.[7] .................................................. G11C 8/00
(52) U.S. Cl. ................. 365/233; 365/240; 365/189.12; 365/194
(58) Field of Search ................................ 365/233, 240, 365/189.12, 194; 713/400, 167

(56) References Cited

U.S. PATENT DOCUMENTS

| | | |
|---|---|---|
| 5,809,263 A | 9/1998 | Farmwald et al. |
| 5,923,611 A * | 7/1999 | Ryan ........................... 365/233 |
| 6,016,282 A | 1/2000 | Keeth |
| 6,026,050 A | 2/2000 | Baker et al. |
| 6,029,250 A * | 2/2000 | Keeth ........................... 713/400 |
| 6,029,252 A | 2/2000 | Manning |
| 6,031,787 A * | 2/2000 | Jeddeloh ...................... 365/233 |
| 6,094,704 A | 7/2000 | Martin et al. |
| 6,094,727 A | 7/2000 | Manning |
| 6,101,197 A | 8/2000 | Keeth et al. |
| 6,101,612 A | 8/2000 | Jeddeloh |
| 6,108,795 A | 8/2000 | Jeddeloh |
| 6,510,503 B2 | 1/2003 | Gillingham et al. |

FOREIGN PATENT DOCUMENTS

| | | | | |
|---|---|---|---|---|
| JP | 2000307421 A | * | 9/2000 | ........... H03L/7/087 |
| WO | WO 01/29680 A1 | | 4/2001 | |

OTHER PUBLICATIONS

Yoon et al., "A 2.5V 333Mb/pin 1Gb Double Data Rate SDRAM", ISSCC Digest of Technical Papers, pp. 412–413, Feb. 17, 1999.

Peter Gillinghan & Bill Vogley, "SLDRAM: High–Performance Open–Standard Memory," IEEE Micro, Nov./Dec. 1997, pp. 29–39, vol. 17, No. 6, Institute of Electrical and Electronics Engineers, Inc. Los Alamitos, California.

SLDRAM Inc., "SLD4M18DR400 4 MEG×18 SLDRAM: 400 Mb/s/pin SLDRAM 4M×18 SLDRAM Pipelined, Eight Bank 2.5 V Operation," Jul. 9, 1998, pp. 1–69, SLDRAM Inc., San Jose California.

* cited by examiner

Primary Examiner—David Lam

(57) ABSTRACT

A signaling system includes a signaling path, a master device coupled to the signaling path, a slave device coupled to the signaling path, and a clock generator. The slave device includes timing circuitry to generate an internal clock signal having a phase offset relative to a clock signal supplied by the clock generator, the phase offset being determined at least in part by a signal propagation time on the signal path.

51 Claims, 16 Drawing Sheets

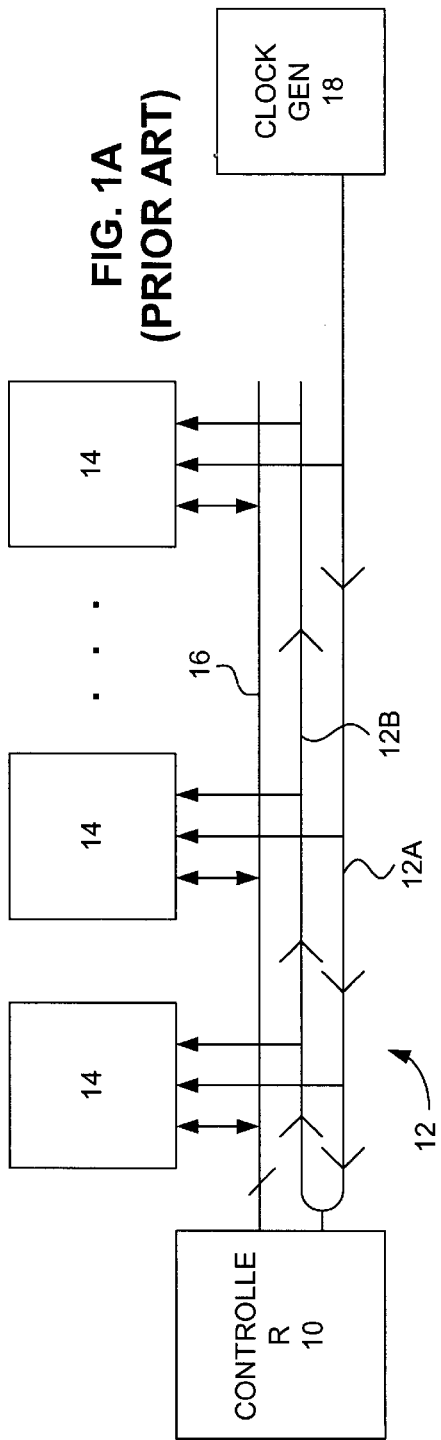
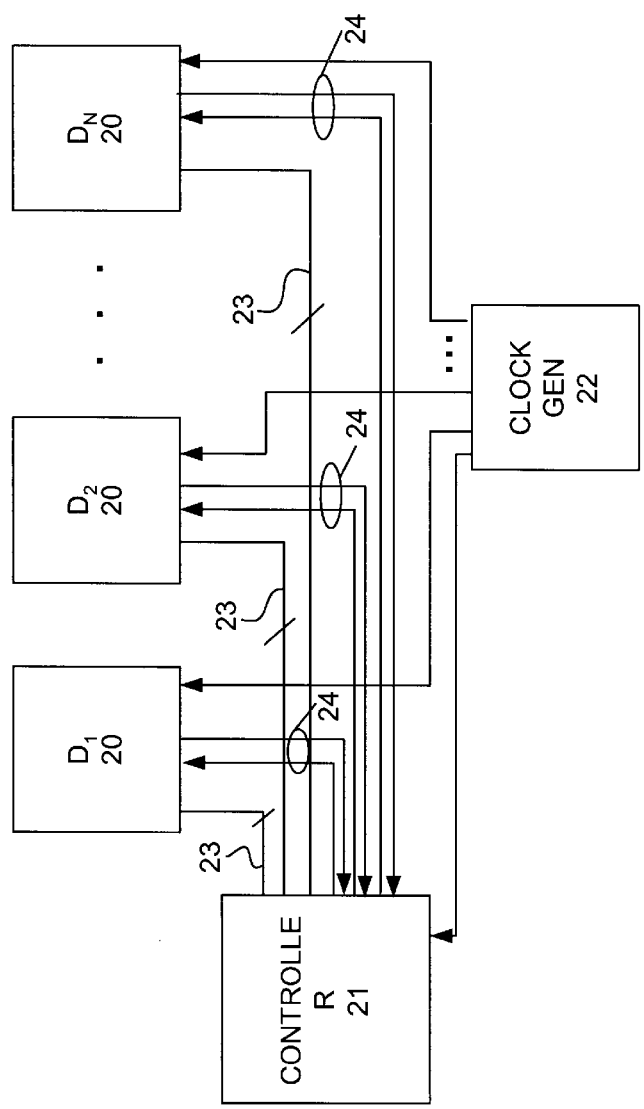

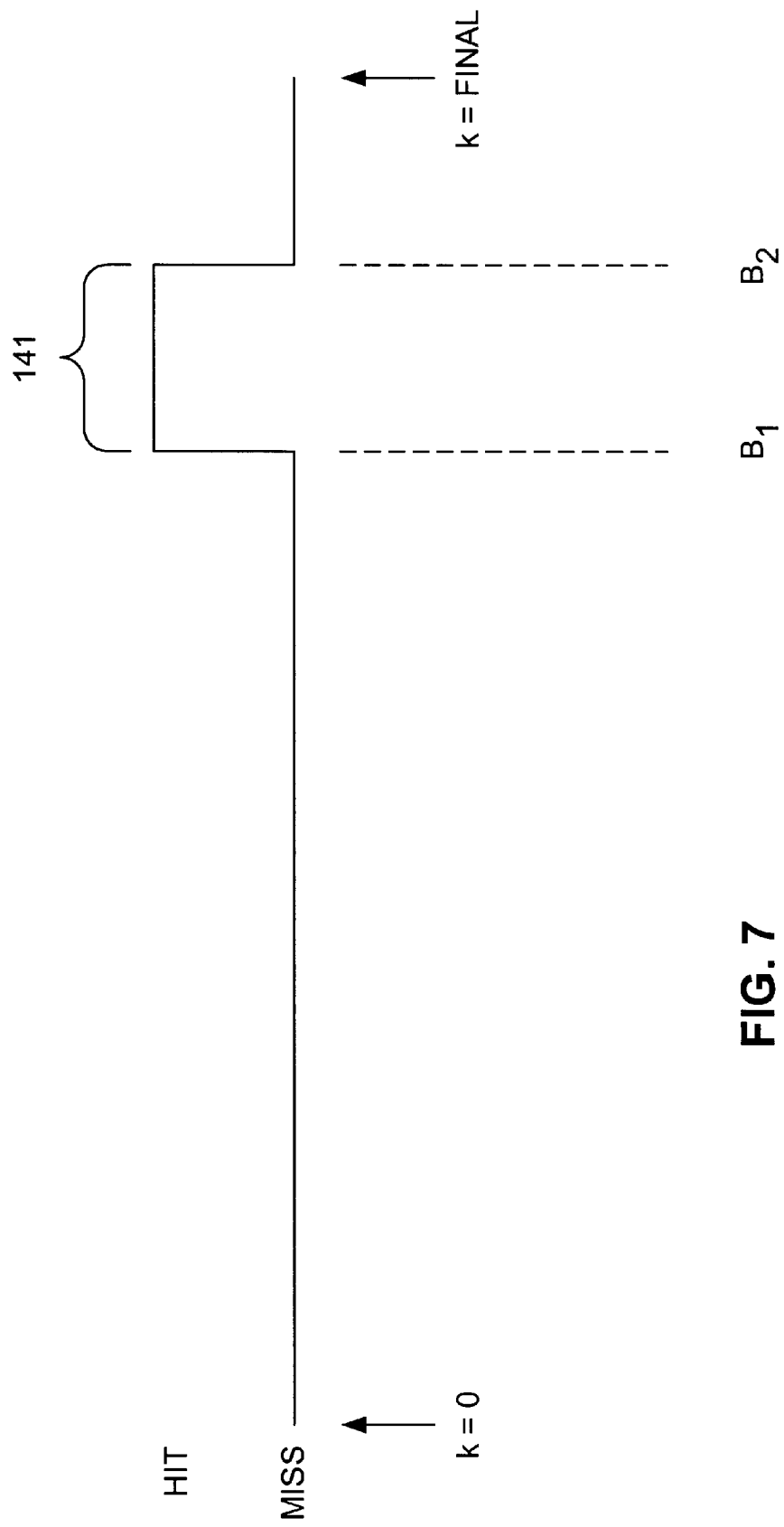

SINGLE-CLOCK, STROBELESS SIGNALING SYSTEM

RELATED APPLICATIONS

The present application is a continuation-in-part (CIP) of U.S. patent application Ser. No. 09/421,073, filed Oct. 19, 1999.

FIELD OF THE INVENTION

The present invention relates to communication systems, and more particularly to apparatus and methods for high speed signaling.

ART BACKGROUND

In systems which require high speed transmission of data between two or more integrated circuit devices, it is common for a timing signal to be transmitted in parallel with the data signal. By this arrangement, sometimes referred to as "source synchronous timing," the timing and data signals experience similar propagation delays, providing the receiving device with a timing reference having a controlled phase relationship with the data signal. Circuitry within the receiving device samples the incoming data signal at a time determined by the timing signal and its phase relationship with the data signal.

FIGS. 1A and 1B illustrate prior-art memory systems that use variants of source-synchronous timing. In the system of FIG. 1A, a folded clockline 12 is used to carry a clock signal toward a controller 10 on a first segment of the clockline and away from the controller on a second segment of the clockline. The clock signal is generated by a clock generator 18. Each of the memory devices 14 includes a pair of clock inputs coupled respectively to the two segments of the folded clockline. The memory devices transmit information to the controller on a data/control path 16 in a fixed phase relationship with the clock signal as it propagates toward the controller on the first clockline segment, and receive information from the controller via the data/control path according to a fixed phase relationship between the information and the clock signal propagating away from the controller on the second clockline segment. Typically, the controller is coupled to the clockline at the fold so that the timing references that it uses for transmit and receive are in phase. By providing source synchronous timing references in this way, timing skew problems that plague other types of high-speed signaling systems are avoided.

In the memory system of FIG. 1B, the memory devices 20 are coupled to a memory controller 21 via respective data paths 23 and also via respective pairs of strobe paths 24. A clock generator 22 is used to provide a frequency reference to the memory controller and each of the memory devices. In operation, the memory controller asserts a strobe signal on one of the pair strobe paths to provide a timing reference for transmission of data to a memory device, and a memory device asserts a strobe signal on the other of the pair of strobe paths to provide a timing reference for transmission of data to the controller. Typically, strobe signal paths are routed and conditioned to equalize the propagation times between strobe signals and corresponding data transmissions. Consequently, the strobe signals constitute source synchronous timing references that facilitate high-speed signaling without timing skew.

One disadvantage of the prior art systems of FIGS. 1A and 1B is that additional pins are required on the memory controller and slave devices, and additional traces are required on the circuit board to support transmission of the source synchronous timing references. The proliferation of traces is particularly problematic in the system of FIG. 1B, because the number of strobe paths is a multiple of the number of memory devices. Consequently, the routing of timing and data paths in such systems is often complex, involving a dozen or more circuit board layers.

Another disadvantage of the prior art systems of FIGS. 1A and 1B is the additional layout complexity that results from the need to equalize the electrical lengths of the timing and data paths to avoid skew between the timing and data signals. Electrical length equalization is particularly challenging in view of the fact that the data path is typically a multi-conductor path having a higher parasitic capacitance than the timing reference paths. Again, the large number of strobe paths required in the system of FIG. 1B further complicates matters. Numerous passive devices are often used for electrical length equalization in such systems, necessitating additional printed circuit board layers.

SUMMARY OF THE INVENTION

A single-clock, strobeless signaling system is disclosed. In one embodiment, the signaling system includes a signaling path, a master device coupled to the signaling path, a slave device coupled to the signaling path, and a clock generator. The slave device includes timing circuitry to generate an internal clock signal having a phase offset relative to a clock signal supplied by the clock generator, the phase offset being determined at least in part by a signal propagation time on the signal path. Various alternative embodiments of the signaling system are disclosed as are embodiments of master and slave devices and methods for operating the same.

BRIEF DESCRIPTION OF FIGURES

The present invention is illustrated by way of example, and not by way of limitation, in the figures of the accompanying drawings and in which like reference numerals refer to similar elements and in which:

FIGS. 1A and 1B illustrate prior art signaling systems;

FIG. 7 illustrates the content of a phase array generated during slave device timing calibration;

DETAILED DESCRIPTION

Single Clock, Strobeless Signaling System

Figure 2:
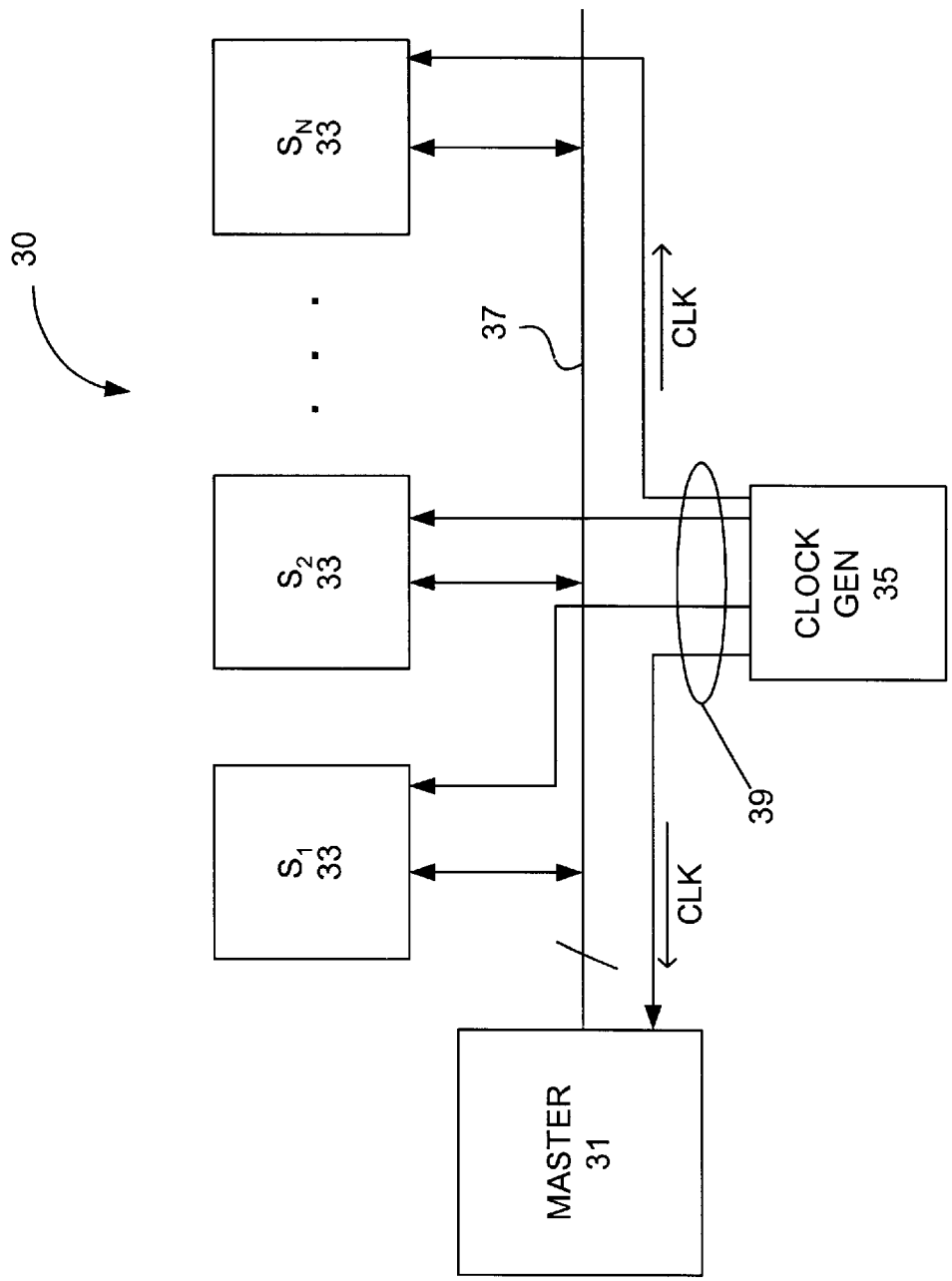
FIG. 2 illustrates a signaling system according to an embodiment of the present invention.

FIG. 2 illustrates a signaling system 30 according to an embodiment of the present invention. The system includes at least one master device 31 coupled to each of a plurality of slave devices 33 via a high-speed signaling path 37. The high-speed signaling path 37 may be multiplexed for transmission of data and control information between the master and slave devices, or a separate path (not shown) may be provided for control information. A clock generator 35 generates clock signals (CLK) that are delivered to the master device and each of the plurality of slave devices via respective clocklines 39. Though shown as a discrete component, the clock generator 35 may alternatively be incorporated into the master device 31. Preferably, each of the slave devices 33 and the master device 31 are implemented in separate integrated circuit packages that are mounted to a printed circuit board, and the clocklines 39 and high-speed signaling path 37 are implemented by electrical traces disposed on or within the printed circuit board. Alternatively, the entire signaling system 30 may be implemented within a single integrated circuit or within two or more integrated circuits disposed within a single integrated circuit package. Also, though the master device 31 and slave devices 33 are shown connected to the clock generator 35 via respective clocklines 39, a single, shared clockline may alternatively be used to deliver a clock signal to the system components. An master-slave system that includes such a shared clockline is described below in reference to FIG. 14.

Still referring to FIG. 2, the electrical lengths of the clock lines 39 are not constrained to be the same as the electrical length of the high-speed signaling path 37, and the signaling system 30 does not include paths for source synchronous timing references as in the prior art systems described above. Instead, a timing calibration operation is performed at system startup to determine the respective data flight time delays between the master device 31 and each slave device 33. This flight time delay is manifested within each slave device 33 as transmit and receive phase offsets relative to the externally received clock signal, CLK. Clock generation circuitry within the slave device 33 generates internal transmit and receive clock signals that are offset from the external clock signal according to the transmit and receive phase offsets determined at system startup. Using this timing scheme, data transmitted to a given slave device 33 by the master device 31 is received under timing control of the slave device's internal receive clock, and data transmitted from a slave device 33 to the master device 31 is transmitted under timing control of the slave device's internal transmit clock. Both data reception and transmission are timed at the master device 31 by the external clock signal, CLK (or a clock signal generated therefrom). In contrast to the prior art systems described above, no source synchronous timing reference is required for transmissions in either direction. By using a clock generator 35 that exhibits negligible frequency drift over changes in temperature (e.g., a high-precision crystal oscillator), receive and transmit clock phase offsets, once determined, remain valid over extended periods of operation.

System Timing

Figure 3:
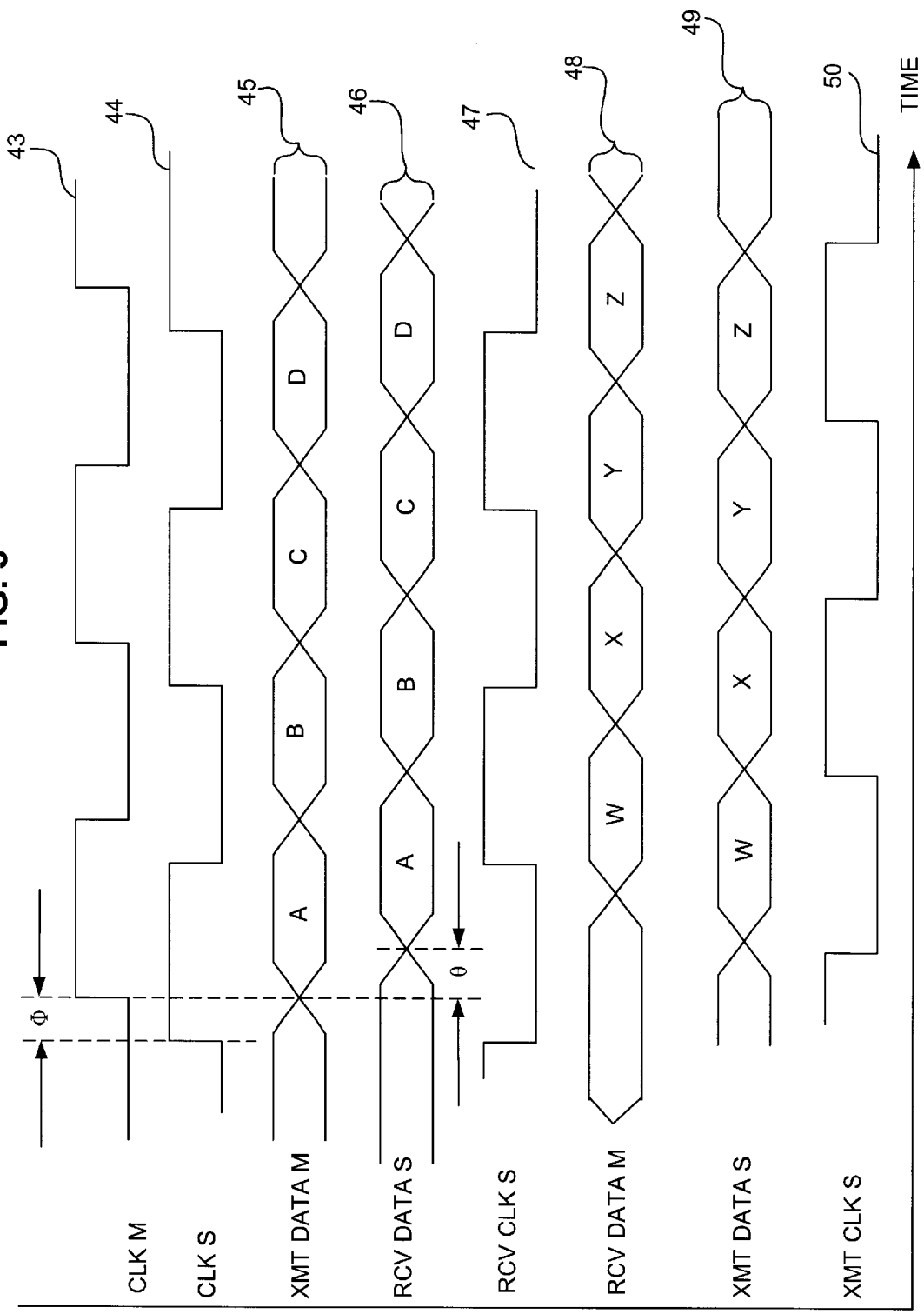
FIG. 3 is a timing diagram for the signaling system of FIG. 2.

FIG. 3 is a timing diagram for a double data rate implementation of the signaling system of FIG. 2 (i.e., two bits of information are transmitted sequentially on the high-speed signaling path per cycle of CLK). A slave clock signal 44 (i.e., the external clock signal received by the slave) leads a master clock signal 43 by an arbitrary phase angle, $\phi$. As shown by master data transmit signal 45, a sequence of data values is transmitted by the master device, with the start of each successive data eye (A, B, C, D) coinciding with a respective edge of the master clock signal 43. The data values arrive at the slave device after a flight time on the high-speed signaling path as indicated by slave data receive signal 46. The data flight time may be expressed as a phase offset, $\theta$, where $\theta$=(data flight time/clock period) * 360°. Receive clock signal 47 is generated within the slave device and used to time reception of the receive data signal 46. In one embodiment, the phase of the receive clock signal 47 is controlled such that edges of the receive clock signal coincide with the center of the data eyes (A, B, C, D) in the slave data receive signal 46. Thus, the phase relationship between the slave receive clock signal 47 and the slave clock signal 44 may be expressed analytically as slave receive clock signal=slave clock signal $+\phi+\theta+90°$. By sampling the incoming data in response to the edges of such a receive clock signal, maximum or near maximum timing margin is achieved.

Still referring to FIG. 3, a data signal 48 to be received by the master device preferably arrives at the master device such that the data eyes (W, X, Y, Z) are centered around the edges of the master clock signal 43, regardless of which slave transmitted the data. Assuming for simplicity that the flight time on the high-speed signaling path is the same in each direction, then the phase of the data signal as it departs from the slave device (i.e., signal 49) leads the data signal at the master 48 by phase angle $\theta$. Assuming further that edges of the slave's internal transmit clock signal are used to time the start of each data eye (W, X, Y, Z), the phase relationship between the slave transmit clock signal 50 and the slave clock signal 44 may be expressed analytically as slave transmit clock signal=slave clock signal $+\phi-\theta-90°$.

Preferably, the phase of the internal receive clock of the slave device is advanced somewhat to compensate for the setup delay of the slave receive circuitry, and the phase of the internal transmit clock of the slave device is advanced to compensate for the output delay (clock-to-Q delay) of the slave transmit circuitry. Such delays are accounted for in the timing calibration operations described below.

Note that while zero phase alignment between transmit clock and data and is assumed throughout this description (i.e., clock edge occurs at start of data eye), such phase alignment is not necessary. Any fixed phase relationship between transmit clock and data may be used in alternative embodiments. Moreover, the fixed phase relationship between the slave transmit clock and data may be different from the fixed phase relationship between the master transmit clock and data.

Slave Device

Figure 4:
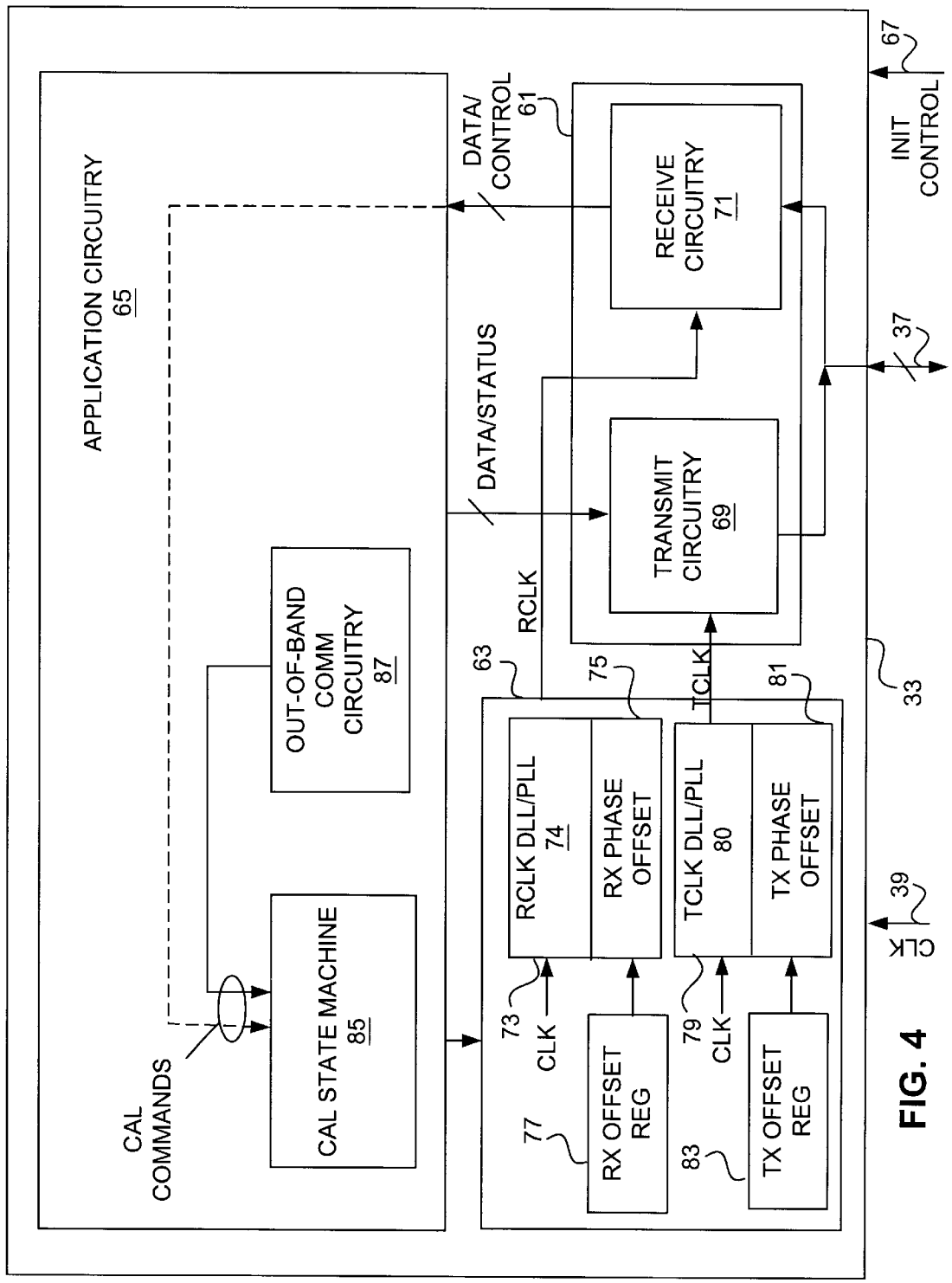
FIG. 4 is a block diagram of a slave device according to one embodiment.

FIG. 4 is a block diagram of a slave device 33 according to one embodiment. The slave device 33 includes three major functional blocks: input/output circuitry 61, timing circuitry 63 and application circuitry 65. The input/output circuitry 61 includes transmit circuitry 69 to transmit information supplied by the application circuitry 65 on the high-speed signaling path 37 and receive circuitry 71 to receive information via the high-speed signaling path 37 and forward the information to the application circuitry 65. Transmit and receive clock signals (TCLK, RCLK) generated by the timing circuitry 63 are supplied to the transmit circuitry 69 and the receive circuitry 71, respectively, to time transmit and receive operations.

The application circuitry 65 varies according to the system in which the slave device 33 is to be used. For example, if the slave device 33 is a memory device in a memory system, the application circuitry 65 will include an array of memory cells and circuitry to access contents of the memory cells in response to address and command information (i.e., control information) received via the receive circuitry 71. In such an application, data to be written to the memory cells is received via the receive circuitry 71, and data read from the memory cells is transmitted to a system master (e.g., a memory controller) via the transmit circuitry 69. As discussed above, the high-speed signaling path 37 may include separate sets of conductors for the data and control information, or the data and control information may be time multiplexed. Similarly, the internal data/control path between the receive circuitry 71 and the application circuitry 65 may include a separate sets of conductors for data and control information or a single path may be time multiplexed. A separate external status path may likewise be provided and the internal data/status path between the application circuitry 65 and the transmit circuitry 69 may also include separate sets of conductors for data and status information or a single path may be time multiplexed. If a separate external control path (or status path) is provided, a separate clock signal may be generated to time receipt (or transmission) of information on that path. Such a clock signal may be operated at a different frequency from RCLK and TCLK.

The timing circuitry 63 includes receive timing circuitry 73 and transmit timing circuitry 79 for generating the receive and transmit clock signals, respectively (i.e., RCLK and TCLK). The receive timing circuitry 73 includes a delay lock loop or phase lock loop (DLL/PLL) 74, a phase offset register 77 and a phase offset circuit 75 to offset the phase of the receive clock signal generated by the DLL/PLL 74 according to the content of the phase offset register 77. More specifically, a phase offset value in the phase offset register 77 is applied to offset the phase of RCLK relative to the reference clock signal, CLK, such that RCLK and CLK have the relationship shown in FIG. 3 for signals 44 and 46. As discussed below, the phase offset value in register 77 is set during a receive timing calibration operation to establish the appropriate phase offset between RCLK and CLK. The transmit timing circuitry 79 includes a transmit DLL/PLL 80 to generate TCLK, and a phase offset register 83 and phase offset circuit 81 to offset the phase of TCLK relative to CLK such that TCLK and CLK have the relationship shown in FIG. 3 for signals 44 and 50. The phase offset value in register 83 is set during a transmit timing calibration operation to establish the appropriate phase offset between TCLK and CLK. As discussed below, the application circuitry 65 includes a calibration state machine 85 for responding to calibration commands from the master device. Slave responses to calibration commands are discussed in detail below, but generally involve transmission and reception of test sequences on the high-speed signaling path 37, and modifying the contents of the transmit and receive phase offset registers 83, 77. Out-of-band communication circuitry 87 is used to support out-of-band communication with the master device, and to forward calibration commands received via out-of-band communication to the calibration state machine 85. As discussed below, out-of-band communication may take place via unused codespace on the high-speed signaling path 37 or via a separate slave device interface to initialization control path 67. Initialization control path 67 may be any connection between the slave device 33 and the master device that permits communication outside the high-speed signaling path. For example, in one embodiment, initialization control path is a serial path that originates at the master device 31 and is daisy chained to each of the slave devices in the system (i.e., the slave device interface to the initialization control path 67 includes a serial input which routes the signal carried on one conductor within path 67 to the out-of-band communication circuitry 87, and a serial output which supplies a signal output by the out-of-band communication circuitry 87 to another conductor within path 67, the serial output of one slave device being coupled to the serial input of another slave device).

The dotted arrow leading to the calibration state machine 85 signifies use of the receive circuitry 71 to receive calibration commands after the phase offset of RCLK has been set.

Still referring to FIG. 4, numerous circuits may be used to offset the phases of the RCLK and TCLK signals relative to CLK based on the contents of the receive and transmit phase offset registers. For example, U.S. patent application Ser. No. 09/421,073, which is hereby incorporated by reference in its entirety, illustrates several techniques for providing offset in a slave DLL/PLL, including replication of phase offset blocks from the DLL/PLL reference loop to allow register-weighted phase mixing of vectors from the replicated blocks to produce a desired phase delay (although +/−45 degree phase delay is shown in the incorporated reference, the concept disclosed is extendible to provide a phase offset selectable over a full 360 degree range); register control of binary-weighted variable loads in the respective feedback paths of the transmit and receive DLL/PLLs; register control of binary-weighted current sources to pre-tilt the input respective input comparators of the transmit and receive DLL/PLLs; register control over a sequence of delay stages in the respective feedback paths of the transmit and receive DLL/PLLs, where the sequence of delay stages mirrors another sequence of delay stages that are controlled via a reference loop to equal a single cycle of a reference clock (e.g., CLK in FIG. 4); and register control of respective offset interpolators within the transmit and receive DLL/PLLs.

Pre-Calibration Communication

In one embodiment, timing calibration is performed during system initialization to determine the proper phase offsets of the RCLK/TCLK signals. Timing calibration is itself somewhat complicated by the need for pre-calibration communication between the master and slave devices to coordinate various calibration operations. In the implementation of FIG. 4, pre-calibration communication is established by way of a dedicated control input for receiving a relatively low speed, self-timed communication signal (e.g., a manchester encoded signal or other encoding format that carries clocking information). In alternative embodiments, unused codespace in an encoding scheme can be used for out-of-band signaling over the high-speed signaling path. For example, in one implementation, ten bits (1024 states) are used to encode each eight-bit unit of information transmitted over the high-speed signaling path. By mapping the 256 possible states of the eight bits of information to include codes in the ten-bit codespace in which at least one high-to-low or low-to-high transition takes place during each cycle of CLK, out of band signaling can be implemented even in the absence of reliable receive/transmit timing by providing "quiet detection" circuitry to detect high/low quiet time on the high-speed signaling path #. For example, an out-of-band 0 may be signaled by transmitting a sequence of 0's of predetermined length without an intervening 1 on each conductor of the high-speed signaling path. Similarly, an out-of-band 1 may be signaled by transmitting a sequence of 1's of predetermined length without an intervening 0 on each conductor of the high-speed signaling path. Similar quiet detection circuitry may be provided within the master device to detect out-of-band slave transmissions on the high-speed signaling path.

Although specific techniques for pre-calibration communication have been described, other techniques for pre-calibration communication between the master and slave devices may also be used without departing from the scope of the present invention (e.g., temporarily operating the high-speed signaling path at a lower frequency). Also, any number of protocols may be used to frame pre-calibration messages addressed to different slave devices and for detecting errors in pre-calibration transmissions (e.g., sequences of start/stop bits to frame transmissions, checksum, cyclic-redundancy-check (CRC) values to detect errors or to mark end of frame, etc.).

Timing Calibration

According to one embodiment, the master device 31 of FIG. 2 relies upon the external clock signal, CLK, to time both transmission and reception of information on the high-speed signaling path. In such an embodiment, timing calibration involves determining the proper phase for the internally generated receive and transmit clocks of each slave device. Assuming that both the transmit and receive clocks of the slave are initially uncalibrated, out-of-band signaling may be used to coordinate calibration of the slave transmit and receive clocks in either order. For example, the slave transmit clock may be calibrated first, allowing the high-speed signaling path to be used during calibration of the slave receive clock. Alternatively, the slave receive clock may be calibrated first, allowing the high-speed signaling path to be used during calibration of the slave transmit clock. In yet another alternative, both the slave receive clock and the slave transmit clock may be calibrated concurrently in the same calibration operation. This latter calibration procedure is referred to herein as a two-dimensional calibration operation and is described below in further detail.

Calibration of slave device transmit and receive clocks is described below from the perspective of the master device and assuming that out-of-band signaling is used for all pre-calibration communication. However, it will be appreciated that, after either the slave transmit clock or the slave receive clock has been calibrated, unidirectional communication over the high-speed signaling path may be used to complete the remaining timing calibration instead of out-of-band signaling.

Figure 5A:
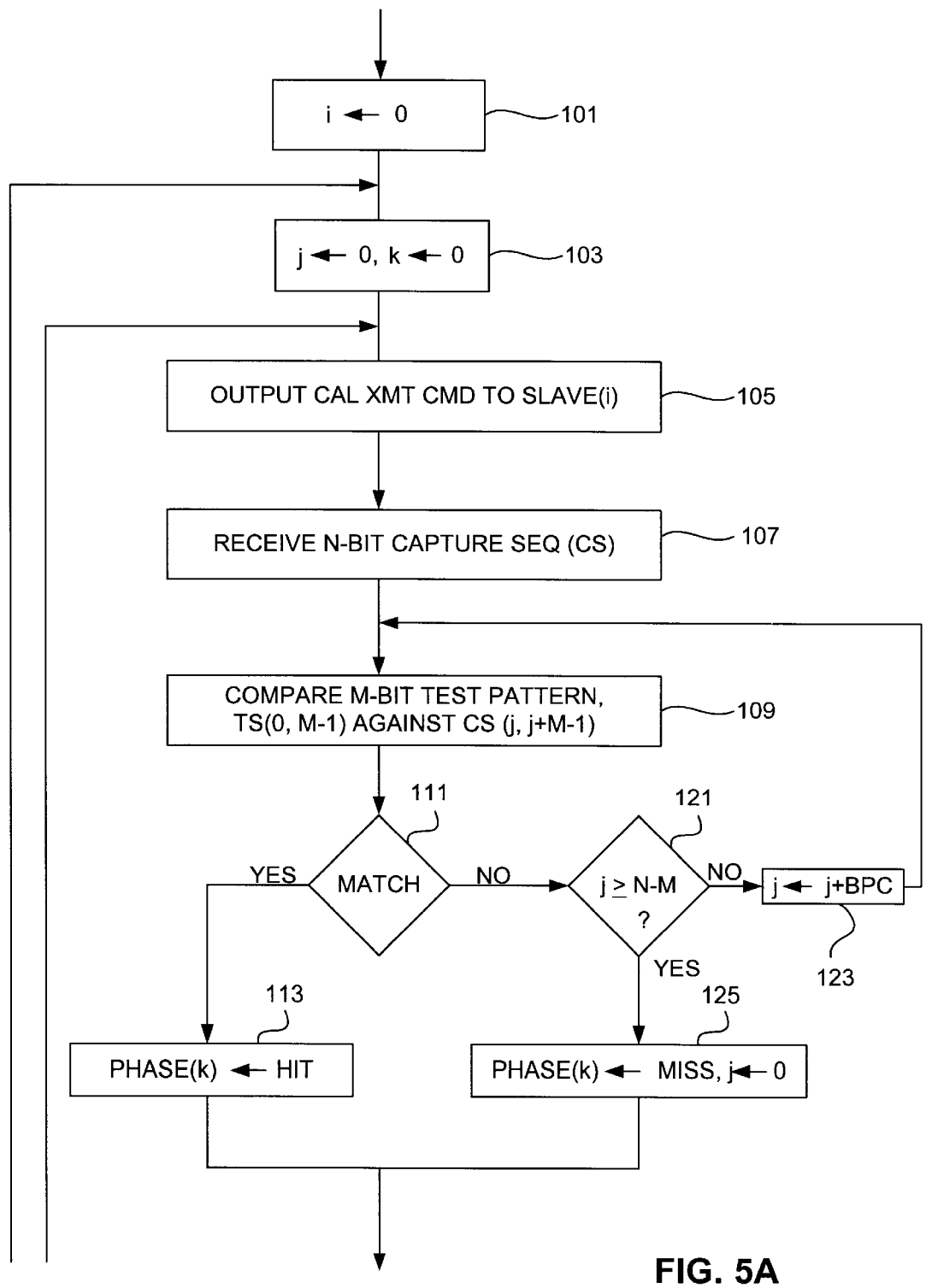
FIGS. 5A and 5B are a diagram of the operations performed by a master device to calibrate the internal transmit clocks of a plurality of slave devices.
Figure 5B:
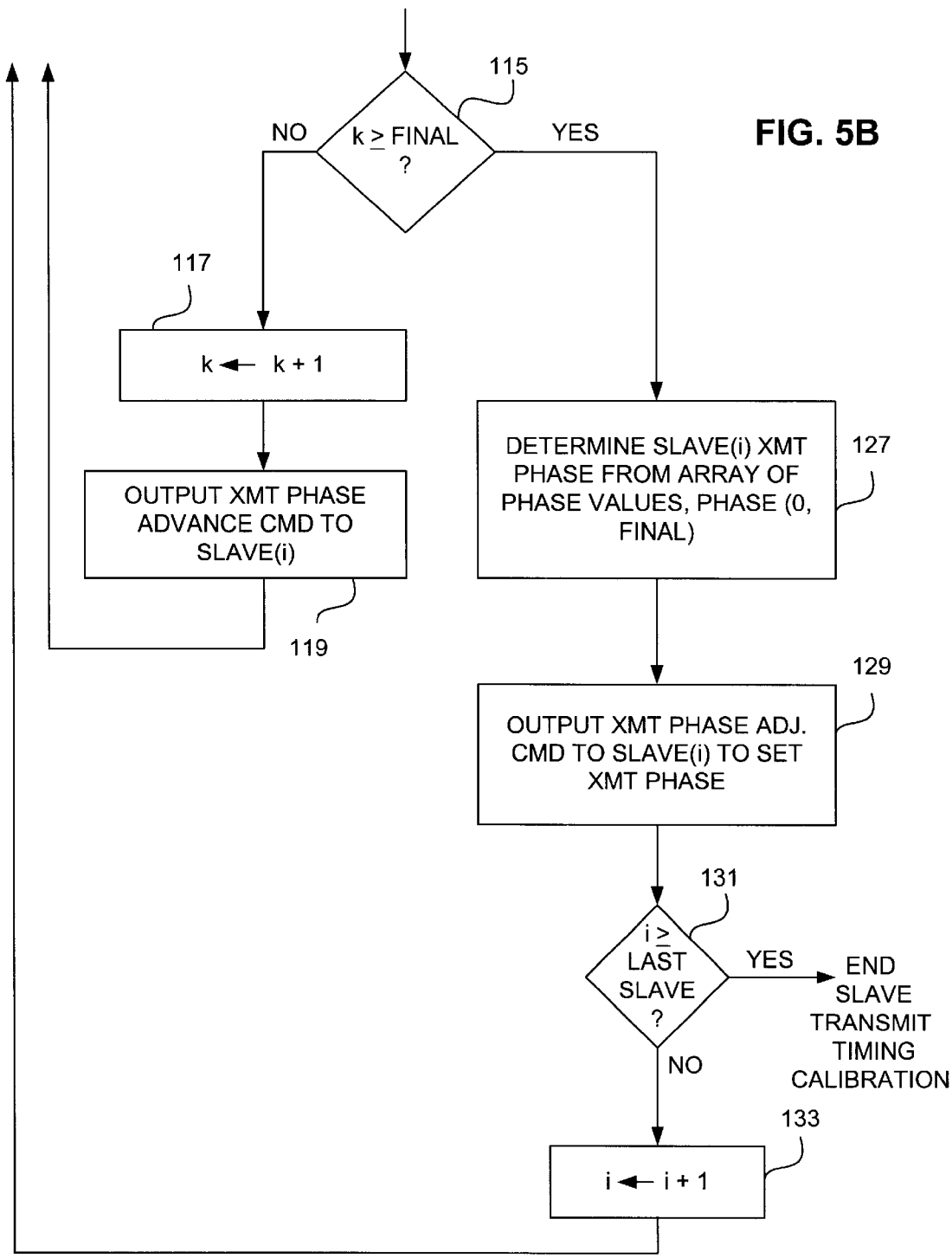

FIGS. 5A and 5B are a diagram of the operations performed by the master device (e.g., element 31 of FIG. 2) to calibrate the internal transmit clock of each of the slave devices. Initially, at blocks 101 and 103 indices i, j and k are reset. Briefly, i represents the slave device being calibrated, j represents an offset into a captured bit sequence and k represents the phase offset being tested. At block 105, the master device outputs a calibration transmit command (CAL XMT) to the $i^{th}$ slave device (e.g., via out-of-band signaling if the slave receive timing has not yet been calibrated). As an aside, in one embodiment, each of the slave devices has an identifier determined, for example, by hard-wired strapping, ID register setting (e.g., via out-of-band signaling during pre-calibration initialization), fuse blowing, etc. The identifier allows the master device to address individual slave devices during timing calibration and later during normal system operation.

The master device expects the slave device to respond to the CAL XMT command by transmitting an M-bit test sequence (TS) on at least one conductor of the high-speed signaling path (as discussed below, the calibration state machine within the slave device controls such a response). Consequently, when the master device receives an N-bit capture sequence via the high-speed signaling path at block 107, the slave transmission should be accurately represented in the capture sequence for at least some setting of the slave device's transmit phase offset register. The value of N is selected to be larger than M (N and M are both integers), to account for the uncertainty of the test sequence flight time on the high-speed signaling path. Flight time could be more than a clock cycle or even several clock cycles depending on the length of the signaling path. Accordingly, N is preferably large enough to capture the M-bit test sequence even if the slave device is the farthest device from the master and the slave transmit clock is as far as possible out of alignment with the clock at the master device.

At block 109, the M-bit test sequence is bit-wise compared against the first M bits of the capture sequence. That is, TS(0) is compared against CS(0), TS(1) is compared against CS(1) and so forth to TS(M−1) and CS(M−1). If all M bits match (decision block 111), then a hit is recorded in an array of phase values (i.e., PHASE(k)=HIT) at block 113. Thereafter, at decision block 115, the index k is tested to determine whether all the possible settings of the transmit phase offset register have been tested (e.g., if the phase offset register is an 8-bit register allowing for 256 possible phase offsets, then K is tested against a final value of 255). If not, then the index k is incremented at block 117 and a transmit phase advance command (XMT PHASE ADV) is output to slave(i) at block 119 to cause the slave device to increment the value in its transmit phase offset register. Execution of the calibration operation then loops back to block 105 to command slave(i) to output the test sequence with the incremented phase offset setting.

Figure 6:
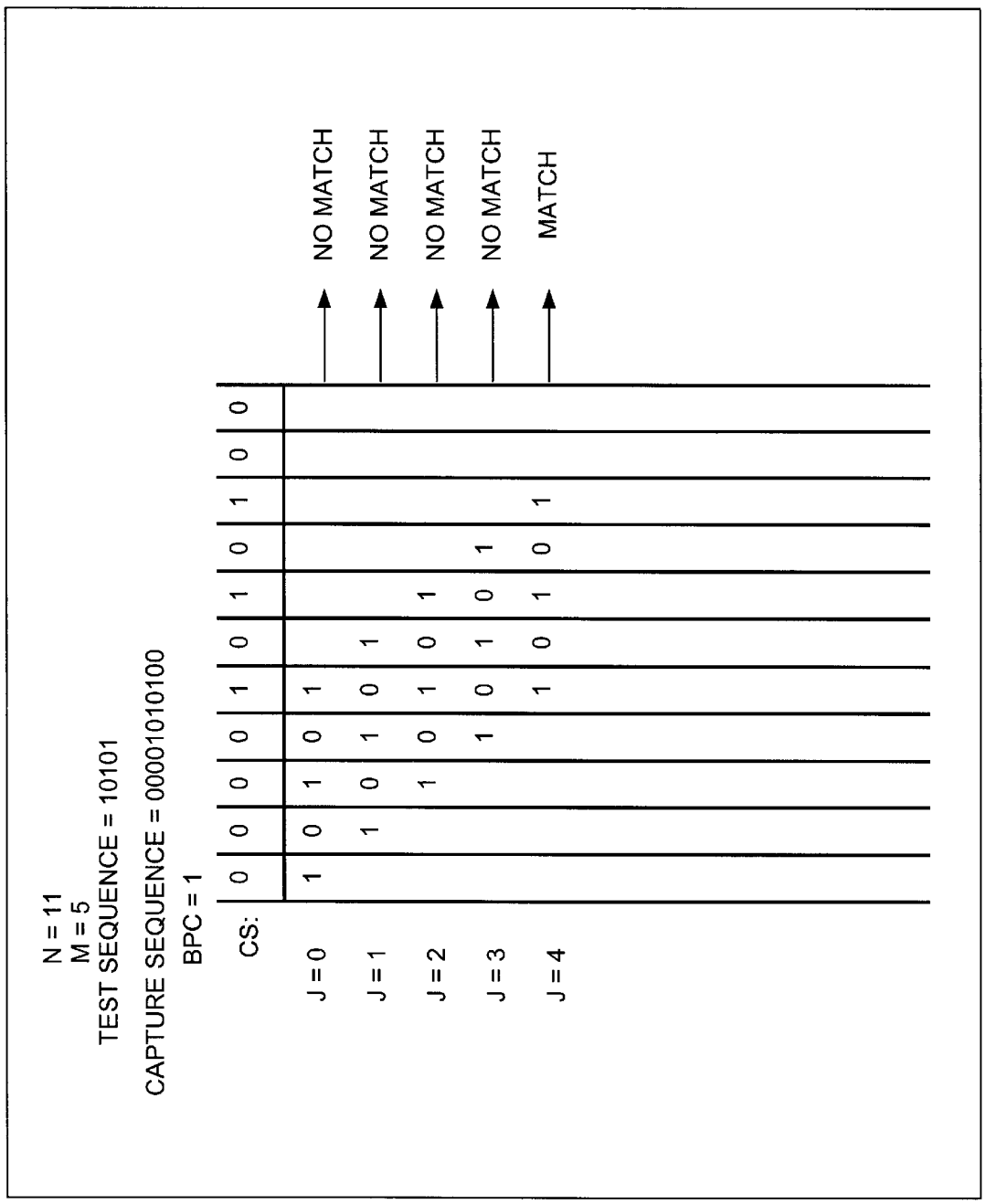
FIG. 6 illustrates an iterative comparison of a test bit sequence and a captured bit sequence.

Returning to decision block 111, if the tested bits of the capture sequence do not match the bits of the test sequence, then index j is tested at decision block 121 to determine whether all the bits of the capture sequence have been tested. If not, j is incremented by a bit-per-cycle (BPC) value at block 123 and the bit-wise comparison of block 109 is repeated. FIG. 6 illustrates the effect of this iterative comparison of the test sequence against successive portions of the capture sequence. Specific values of CS, TS, N and M are shown for exemplary purposes only (i.e., N=11, M=5, TS=10101, CS=00001010100 and BPC=1). Thus, when j=0, TS(0,4) is bit-wise compared against CS(0,4) resulting in a non-match. When, j=1, TS(0,4) is bit-wise compared against CS(1, 5) (i.e., CS(j, j+M−1)) again resulting in a non-match. These comparisons are repeated with incremented values of j, until j=4. Because TS(0,4)=CS(4, 8), a match is indicated. Returning to the diagram of FIGS. 5A and 5B, if j reaches N−M without a match (this condition is detected at decision block 121), then at block 125 a miss is recorded in the phase array (i.e., PHASE(k)=MISS) and k is tested at decision block 115 as described above.

As mentioned above, the purpose for comparing the test sequence against bits at different offset positions within the capture sequence is that the number of clock cycles required for data propagation from slave(i) to the master device on the high-speed signaling path is initially unknown. Accordingly, the amount by which j is incremented in block 123 is selected to correspond to a cycle of the slave device transmit clock. Hence, the bit-per-cycle increment. If the system is operated as a single data rate system (one bit per cycle), then j is incremented by one at block 123 to effect a full clock cycle offset into the capture sequence. If the system is operated as a double data rate system (two bits per cycle), then j is incremented by two at block 123, and so forth for any data rate.

If, at decision block 115, k is determined to be the last phase offset to be tested (i.e., K=FINAL), then all the values of the phase array have been assigned either HIT or MISS values. Accordingly, at block 127, the phase array is evaluated to identify a range of HIT values. The content of the phase array at this point is illustrated graphically in FIG. 7. The phase array indices that mark the start and end of the HIT range 141 (i.e., indices B1 and B2) are used to calculate a transmit phase offset value. More specifically, the transmit phase offset value is calculated to be the midpoint between the B1 and B2 indices (i.e., if B2−B1 <FINAL/2, then TX PHASE OFFSET=(B2−B1)/2, else TX PHASE OFFSET= (B1+FINAL−B2)/2). The latter expression accounts for the possibility of B2 wrapping around the end of the phase array to a lesser K value than B1.

Returning to FIGS. 5A and 5B, at block 129, the master device outputs a transmit phase adjust command (XMT PHASE ADJ) to slave(i) to command the slave device to set the transmit phase offset to the value calculated in block 127 (e.g. via out-of-band signaling if the slave receive timing has not yet been calibrated). At decision block 131, the index i is tested to determine if the transmit timing calibration has been completed for all the slaves. If not, i is incremented at block 133 and the transmit timing calibration is repeated for the next slave device in the system.

Figure 8A:
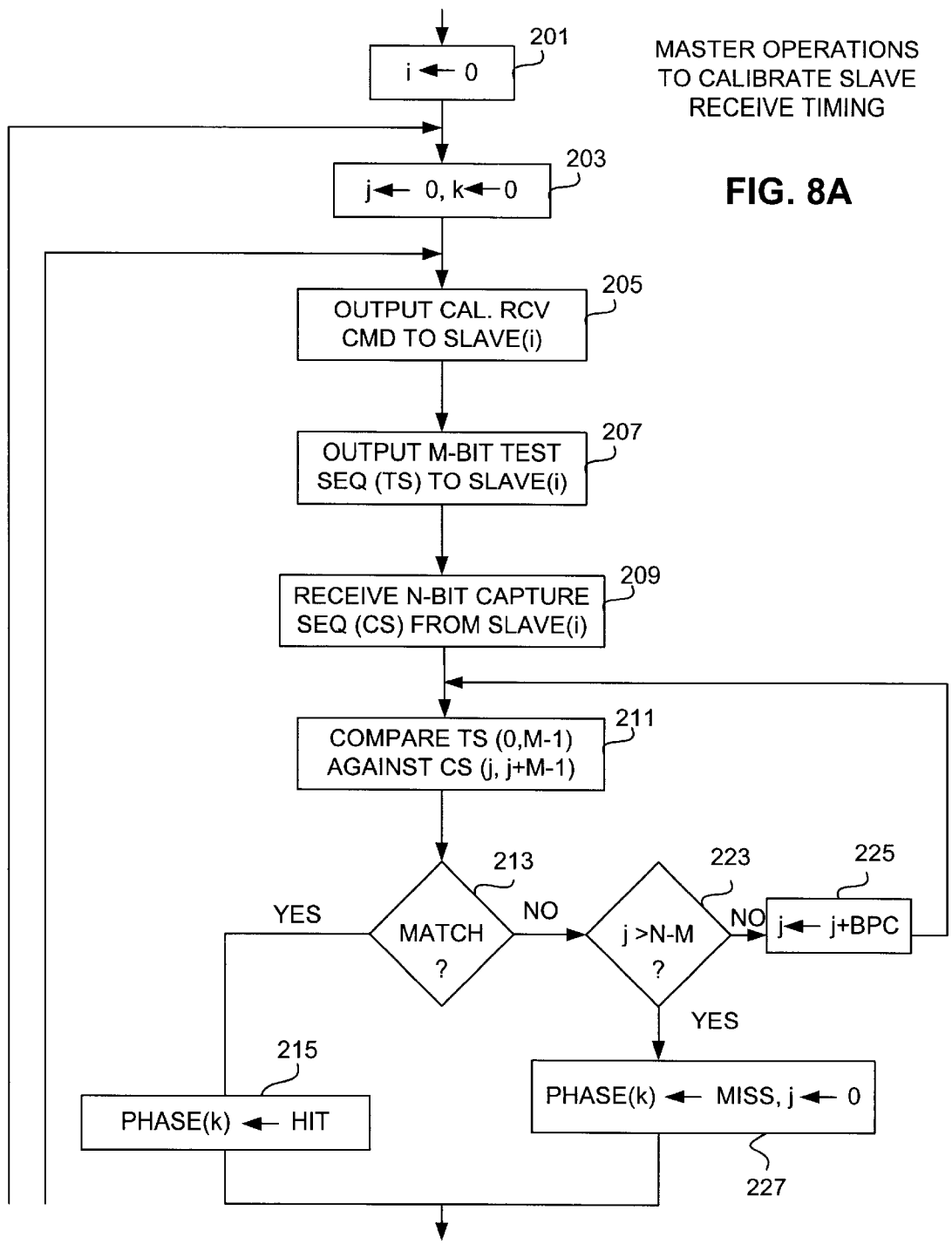
FIGS. 8A and 8B are a diagram of the operations performed by a master device to calibrate the internal receive clocks of a plurality of slave devices.
Figure 8B:
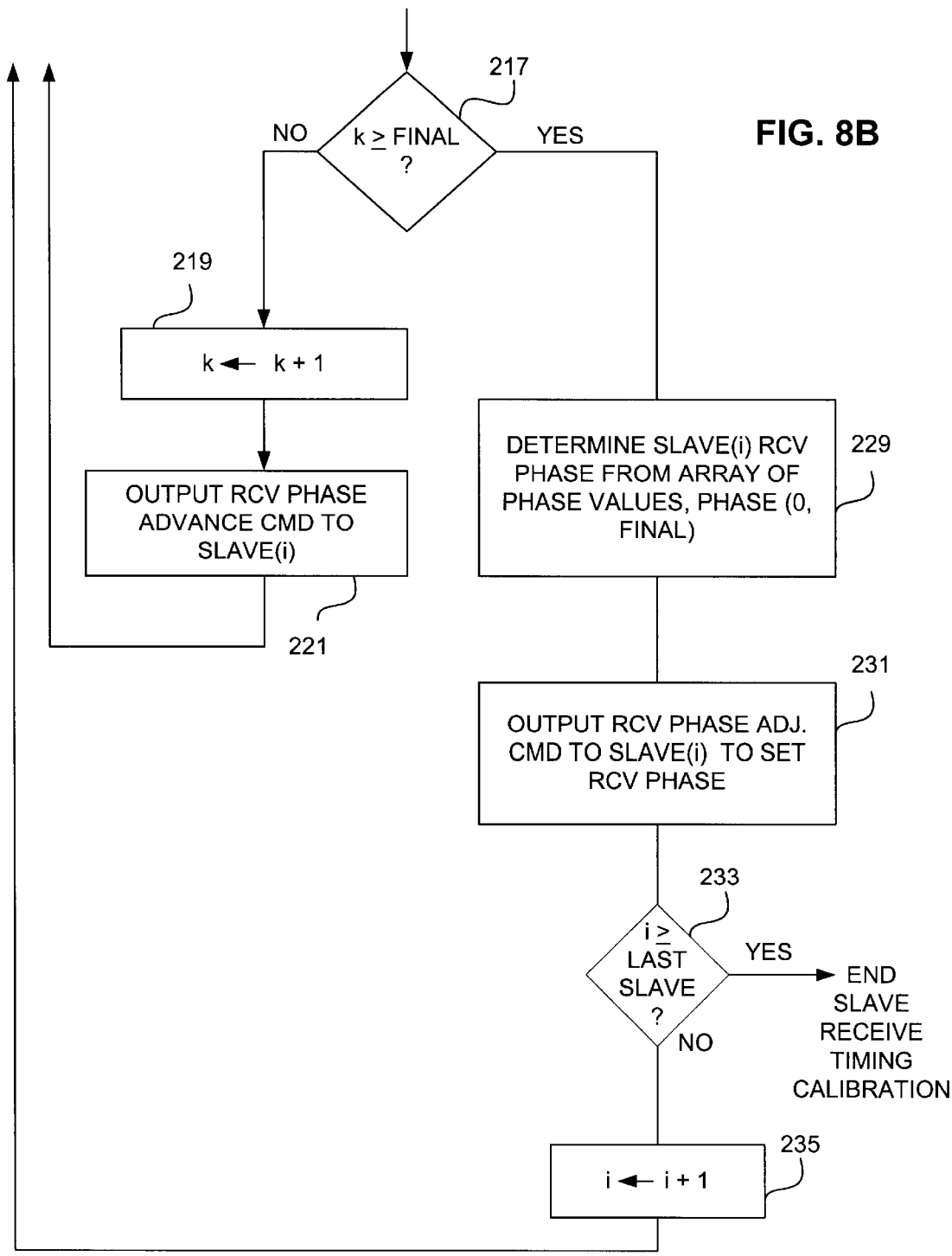

FIGS. 8A and 8B are a diagram of the operations performed by the master device to calibrate the internal receive clock in each of the slave devices. Initially, at blocks 201 and 203, indices i, j and k are reset. As with transmit timing calibration, index i represents the slave being calibrated, j represents an offset into a capture sequence and k represents the phase offset being tested. At block 205, the master device outputs a calibration receive command (CAL RCV) to the $i^{th}$ slave device (e.g., via out-of-band signaling). At block 207, the master device outputs an M-bit test sequence (TS) to slave(i). As discussed below, the calibration state machine within the slave device responds to the CAL RCV command by capturing an N-bit capture sequence via the high-speed signaling path, then transmitting the capture sequence to the master device (e.g., via out-of-band signaling if the slave transmit timing calibration has not been completed). Accordingly, at block 209 the master device receives an N-bit capture sequence that should include an accurate representation of the test sequence for at least some setting of the slave device's receive phase offset register. As with the transmit timing calibration discussed above, the value of N is preferably larger than M due to the uncertainty of the data flight time on the high-speed signaling path between the master device and slave(i).

At block 211, the test sequence is bit-wise compared against the capture sequence received and retransmitted by slave(i) to determine whether the test sequence was accurately received by the slave device. The operations performed in blocks 211–235 are analogous to the operations described in blocks 109–133 of FIGS. 5A and 5B, except that commands output to the slave device are directed to advancing and adjusting the receive phase offset instead of the transmit phase offset. Specifically, at block 221, the master device outputs a receive phase advance command (RCV PHASE ADV) to slave(i) (e.g., via out-of-band signaling), at block 229, the receive phase offset (RX PHASE OFFSET) is determined for slave(i) instead of the transmit phase offset, and at block 231 the master device outputs a receive phase adjust command (RCV PHASE ADJ) to set the receive phase offset register of slave(i) to the receive phase offset determined in block 229.

Figure 9:
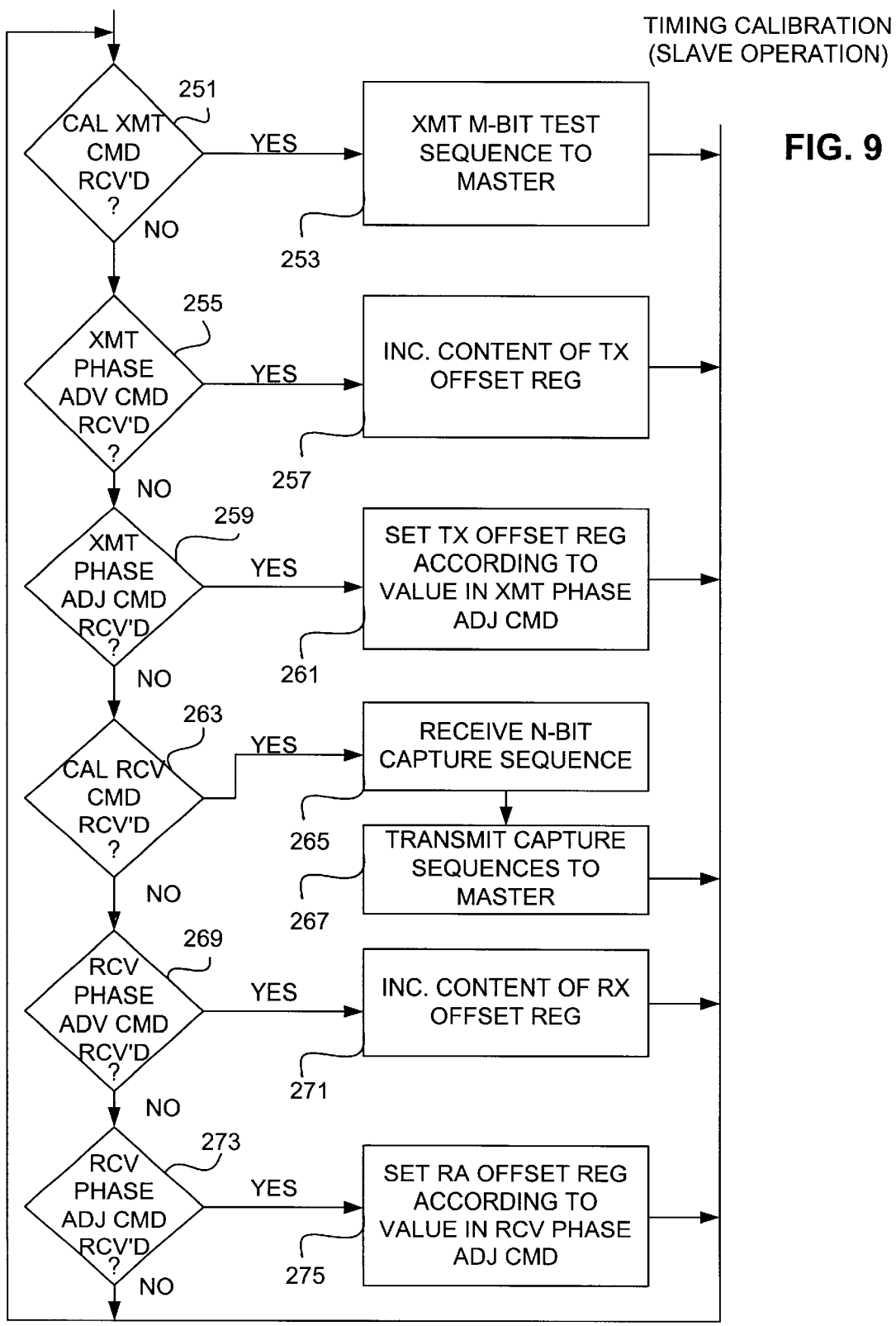
FIG. 9 is a diagram of slave device responses to calibration commands from a master device.

FIG. 9 is a diagram of slave device responses to calibration commands from the master device. Referring briefly to FIG. 2, calibration commands received in the slave device via out-of-band signaling techniques or via the high-speed signaling path (i.e., after receive timing calibration) are supplied to the calibration state machine 85 which controls other circuitry within the slave device to carry out the commanded operation. As shown in FIG. 9, the calibration state machine implements a series of comparison operations to determine whether an incoming command requires a responsive calibration action. In the case of a CAL XMT command detected at decision block 251, the calibration state machine responds at block 253 by causing an M-bit test sequence to be transmitted to the master device via the high-speed signaling path. In the case of a XMT PHASE ADV command detected at decision block 255, the calibration state machine responds at block 257 by incrementing the value in the transmit phase offset register (i.e., element 83 of FIG. 2). In the case of a XMT PHASE ADJ command detected at decision block 259, the calibration state machine responds at block 261 by loading the specified phase offset value into the transmit phase offset register. According to one embodiment, the transmit phase offset register is implemented by a register that can be incremented by asserting a pulse at a first strobe input (e.g., a clock input), and that can be loaded with an arbitrary value by assertion of the value to be loaded at a series of load inputs and concurrent assertion of a pulse at a second strobe input (e.g., a preload input).

Still referring to FIG. 9, when a CAL RCV command is detected at decision block 263, the calibration state machine responds by causing a sequence of N bits to be captured by the slave device's receive circuitry at block 265, followed by retransmission of the N-bit sequence to the master device at block 267. Retransmission of the N-bit sequence may be performed in-band via the high-speed signaling path if transmit timing calibration has been completed (a state preferably recorded by the calibration state machine), or via out-of-band signaling. If a RCV PHASE ADV command is detected at decision block 269, the calibration state machine responds at block 271 by incrementing the value in the receive phase offset register (element 77 of FIG. 2). If a RCV PHASE ADJ command is detected at decision block 273, the calibration state machine responds at block 275 by loading the receive phase offset register with the phase offset value specified in the command. The receive phase offset register may be implemented with the same type of register circuit as the transmit phase offset register to facilitate the increment and load operations of blocks 271 and 275.

It should be noted that the calibration state machine may respond to other commands not shown in FIG. 9. For example, in one embodiment, each of the slave devices automatically resets its transmit and phase offset registers at power-up. Alternatively, the slave devices may respond to an explicit reset command to reset the transmit and receive phase offset registers, or even separate transmit phase reset and receive phase reset commands to reset the respective transmit and receive phase offset registers. Also, in one embodiment, the test sequence transmitted by a slave device in response to a CAL XMT command is preset within the slave device. Alternatively, an explicit test sequence command may be output by the master device to set the test sequence to be transmitted in response to a CAL XMT. The test sequence may be recorded in the slave device and then transmitted thereafter in response to each CAL XMT command, or a new test sequence may accompany each CAL XMT command from the master device. Further, the slave device may transmit a default test sequence unless commanded by the master device to transmit a different test sequence.

Clock Cycle Alignment/Latency Levelization

It has been assumed thus far that the respective flight times on the high-speed signaling path between the slave devices and the master device are such that, in absence of slave transmit timing calibration, all slave transmissions would still arrive at the master device within the same clock cycle. In such a system, the same value of the index variable j (FIGS. 5A, 5B, 8A and 8B) should result in test sequence matches for each slave device in the system (albeit at different phase offsets, k). In a more general system, however, the slave devices may be sufficiently spaced apart (or the clock frequency sufficiently high) that slave-to-master flight times on the high-speed signaling path differ by more than a clock cycle. In that case, different values of the index variable j will result in test sequence matches for different slave devices in the system. Accordingly, in order to levelize roundtrip latency in such a system, the value of j (i.e., clock cycle offset) for each slave device is recorded within a latency register in the slave device to cause the slave device to pad transmissions to the master. For example, if the clock cycle offset (j) for the slave device nearest the master is zero and the clock cycle offset for the slave device farthest from the master is two, then the latency register of the nearest slave device would be programmed to four (two cycles of delay in each direction) and the response latency register of the farthest slave device would be programmed to zero. Response latency registers within slave devices between the slaves nearest and farthest from the master would be programmed with values between zero and four according to their respective clock cycle offsets. More generally, the overall transmit delay for each slave, i, may be expressed as:

Transmit Delay=CYCLE DELAY+TX PHASE OFFSET, where CYCLE DELAY=2*(Clock Cycle Offset (farthest slave)–Clock Cycle Offset (i)).

Figure 10:
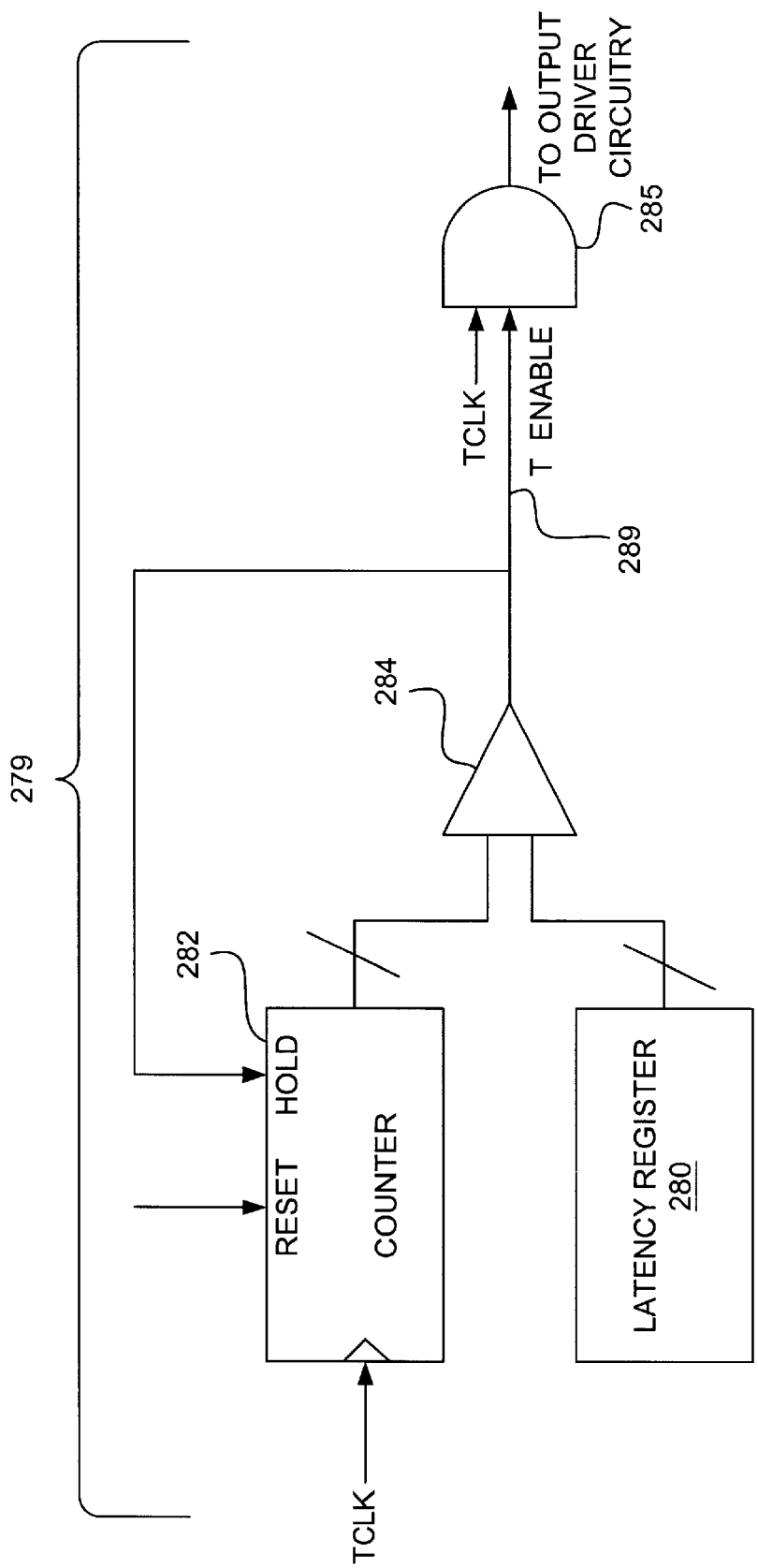
FIG. 10 illustrates a circuit that may be included within a slave device to provide configurable clock cycle delay.

FIG. 10 illustrates a circuit 279 that may be included within the slave transmit circuitry (element 69 of FIG. 4) to provide configurable clock cycle delay. A programmable latency register 280 is loaded with a cycle delay value, preferably by the slave's calibration state machine (element 85 of FIG. 4) as part of transmit timing calibration. When the application circuitry of the slave device (element 65 of FIG. 4) detects a command from the master device that requires a responsive slave transmission, the application circuitry asserts a reset signal to a counter 282 to clear the count value therein. The count value is incremented thereafter during each cycle of the transmit clock. A comparator 284 detects when the count value reaches the cycle delay value and outputs a transmit enable signal 289 in response. The transmit enable signal 289 is applied to a hold input of the counter 282, effectively latching the transmit enable signal 289 until the counter 282 is reset by the slave device application circuitry. The transmit enable signal 289 is also asserted to logic gate 285 which then passes TCLK to the output driver circuitry. The end result is that assertion of TCLK to the output driver circuitry is delayed by a number of TCLK cycles equal to the cycle delay value in register 280. Numerous changes may be made to the circuit of FIG. 10 and numerous other circuits may be used to achieve configurable clock cycle delay without departing from the scope of the present invention.

Although latency levelization has been described in terms of slave device action (i.e., delaying responsive transmission to the master device), latency levelization may also be performed in the master device. For example, the master device may record a latency value per slave so that the master will know how many integral cycles of delay to expect before receiving a responsive transmission from a given slave device.

Concurrent Calibration of Slave Receive and Transmit Timing

Figure 11:
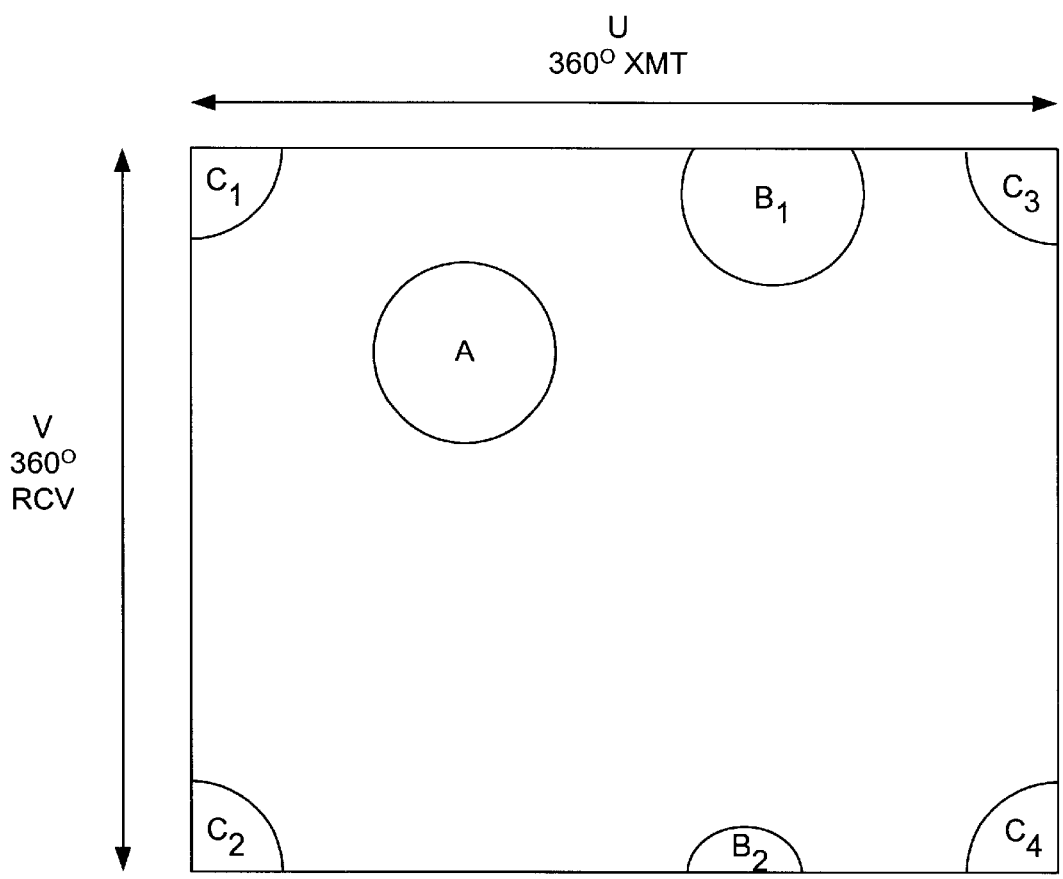
FIG. 11 illustrates the content of a two-dimensional phase array generated during slave device timing calibration.

As mentioned briefly above, both slave receive timing and slave transmit timing may be concurrently calibrated instead of one after the other. For example, phase hit/miss information may be recorded in a two dimensional phase array, PHASE(u, v), with the index u representing the range of phase offsets for the slave transmit clock and v representing the range of phase offsets for the slave receive clock. For each possible u, v combination, the master device transmits an out-of-band CAL RCV command to a selected slave device, then transmits an M-bit test sequence to the slave device via the high-speed signaling path. The slave device, responds to the CAL RCV command as shown in blocks 265, 267 of FIG. 9 (i.e., receiving then retransmitting a capture sequence), except that in block 267, the slave device transmits the capture sequence to the master device via the high-speed signaling path rather than using out-of-band signaling. Accordingly, the master device delays for a predetermined time after transmitting the M-bit test sequence to the slave device, then receives an R-bit capture sequence from the slave device via the high-speed signaling path (R>N>M). The master device compares the original M-bit test sequence against the R-bit capture sequence in the manner described in reference to FIG. 6, then assigns a HIT or MISS value to the phase array location u, v accordingly. FIG. 11 graphically illustrates the contents of the two-dimensional phase array after each of the u, v phase combinations have been tested. Circle A illustrates a first possible result of the two-dimensional calibration operation—settings of the transmit phase offset and receive phase offset that correspond to u, v indices which map within circle A result in pattern matching. Accordingly, the transmit phase offset register and the receive phase offset register would be set to the values that correspond to the u, v coordinates of the circle A center. Circle B, made up of regions B1 and B2 illustrate another possible result, and circle C, made up of regions C1, C2, C3 and C4 illustrate yet another possible result. In each case, the regions define a pair of u, v coordinates that correspond to the desired setting of the transmit and receive phase offset registers.

As discussed above, by designing the circuit that generates the frequency reference signal (CLK) to exhibit negligible frequency drift, one-time calibration of slave device receive and transmit timing should be sufficient to allow reliable operation for an extended period thereafter. However, in systems or embodiments where periodic timing calibrations are desirable, such calibrations may be performed during quiet intervals on the high-speed signaling path. Because the calibration operations can be interrupted between any of the blocks of FIGS. 5A, 5B, 8A and 8B, calibration operations may be carried out over an extended period of time (e.g., one slave device may be calibrated over a period of milliseconds, seconds or longer), with negligible consumption of bandwidth of the high-speed signaling path. Such calibrations may be performed periodically (e.g., in round robin fashion, one slave after another), or in response to detected events such as threshold bit error rates or other system error.

The timing calibration techniques described in reference to FIGS. 5A, 5B, 8A, and 8B involve an incremental search for the proper transmit and receive phase offsets. Phase offsets are tested in a linear sequence to identify the center of a passing phase range. In alternative embodiments, other types of searches for the passing phase range may be implemented, including without limitation binary searching for the passing range, and binary searching (coarse search for passing range) followed by linear searching (fine, localized searching for the precise start and end of the passing range).

Master Device

Figure 12:
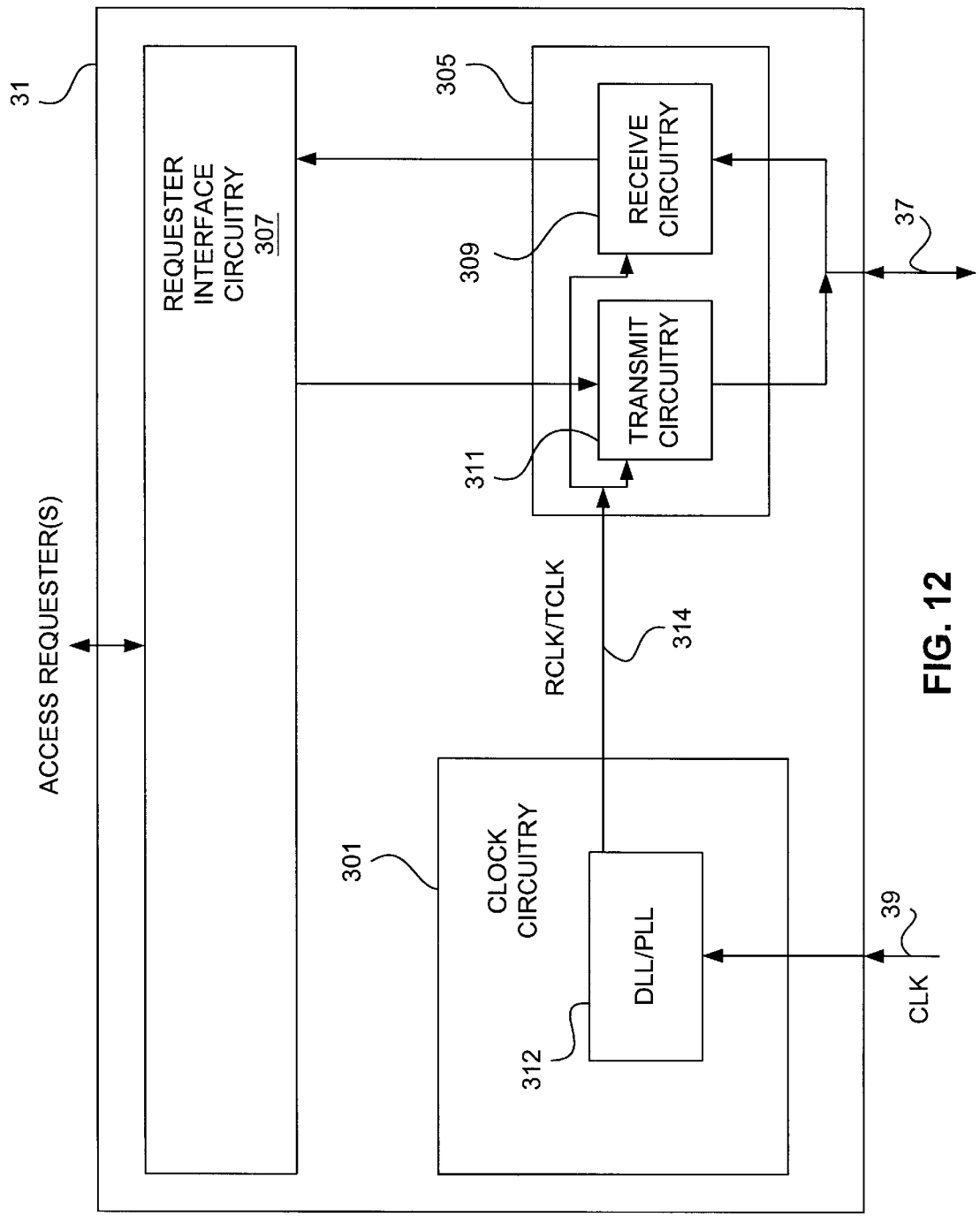
FIG. 12 is a block diagram of a master device according to one embodiment.

FIG. 12 illustrates the master device 31 of FIG. 2 according to one embodiment. The master device 31 includes clock circuitry 301, input/output circuitry 305 and requester interface circuitry 307. The clock circuitry 301 includes a DLL/PLL 312 to generate a transmit/receive clock signal 314 based on the external clock signal 39. The input/output circuitry 305 includes transmit circuitry 311 and receive circuitry 309 to transmit and receive information on the high-speed signaling path 37 under timing control of the transmit/receive clock signal 314. The requester interface circuitry 307 responds to requests to access the slave devices by transmitting corresponding access commands to the slave devices via the high-speed signaling path 37. For example in a memory system, the master device is a memory controller that responds to requests to access slave memory devices by transmitting write commands and write data on the high-speed signaling path 37 and by transmitting read commands and receiving read data on the high-speed signaling path 37.

According to one embodiment, the requester interface circuitry 307 includes logic to perform the master-side calibration operations described in reference to FIGS. 5A, 5B, 8A, and 8B, including maintaining the index variables and phase array, and performing the described bit-wise comparisons. It will be appreciated, however, that many of the computations and comparisons involved in the master-side calibration operations are better suited to being performed by a programmed processing device, such as a general purpose processor or digital signal processor. Thus, in an alternative embodiment of the master device, the requester interface circuitry 307 includes calibration control circuitry that responds to calibration commands from an access requester to perform the master-side calibration operations described in reference to FIGS. 5A, 5B, 8A, and 8B. The calibration commands from the access requester parallel normal operation commands in that they generally request the master to transmit information to the slave device and to forward information from the slave device to the access requester. Referring to FIGS. 5A and 5B, for example, index variables i, j and k are maintained by an access requester, such as a programmed processor (the values of the variables may be kept, for example, in a temporary storage accessible by the access requester), and the operations of blocks 105 and 107 are performed by the master device when requested by the access requestor. In the case of blocks 105 and 107, the calibration control circuitry within the master device responds to a request to transmit a CAL XMT command to a specific slave device by transmitting the CAL XMT command, receiving the capture sequence, and forwarding the capture sequence to the access requester (the requester may provide a test sequence to be sent with the CAL XMT command, a separate request to the master device may be used to express the test sequence, or a preset test sequence within the master device may be used). Overall, the operation is similar to a memory read operation. The access requestor performs the bit-wise comparison of the test sequence and the capture sequence, assignment of HIT/MISS to each entry in the phase array, determination of the TX PHASE OFFSET value (i.e., block 127 of FIG. 5B), and all evaluations of the indices i, j and k. Similarly, the master device transmits the XMT PHASE ADV and XMT PHASE ADJ commands to the slave device when requested to do so by the access requestor. Receive timing calibration and, if implemented, the two-dimensional calibration operation described in reference to FIG. 11 may also be performed at the direction of an access requester. By this arrangement, calibration control logic within the master device may be made as simple as possible. Computational circuitry elsewhere in the system can be used to direct the master-side calibration operations under program control, including making all necessary comparisons, and maintaining the HIT/MISS array and index variables.

Application of Single-Clock. Strobeless Signaling System

Figure 13:
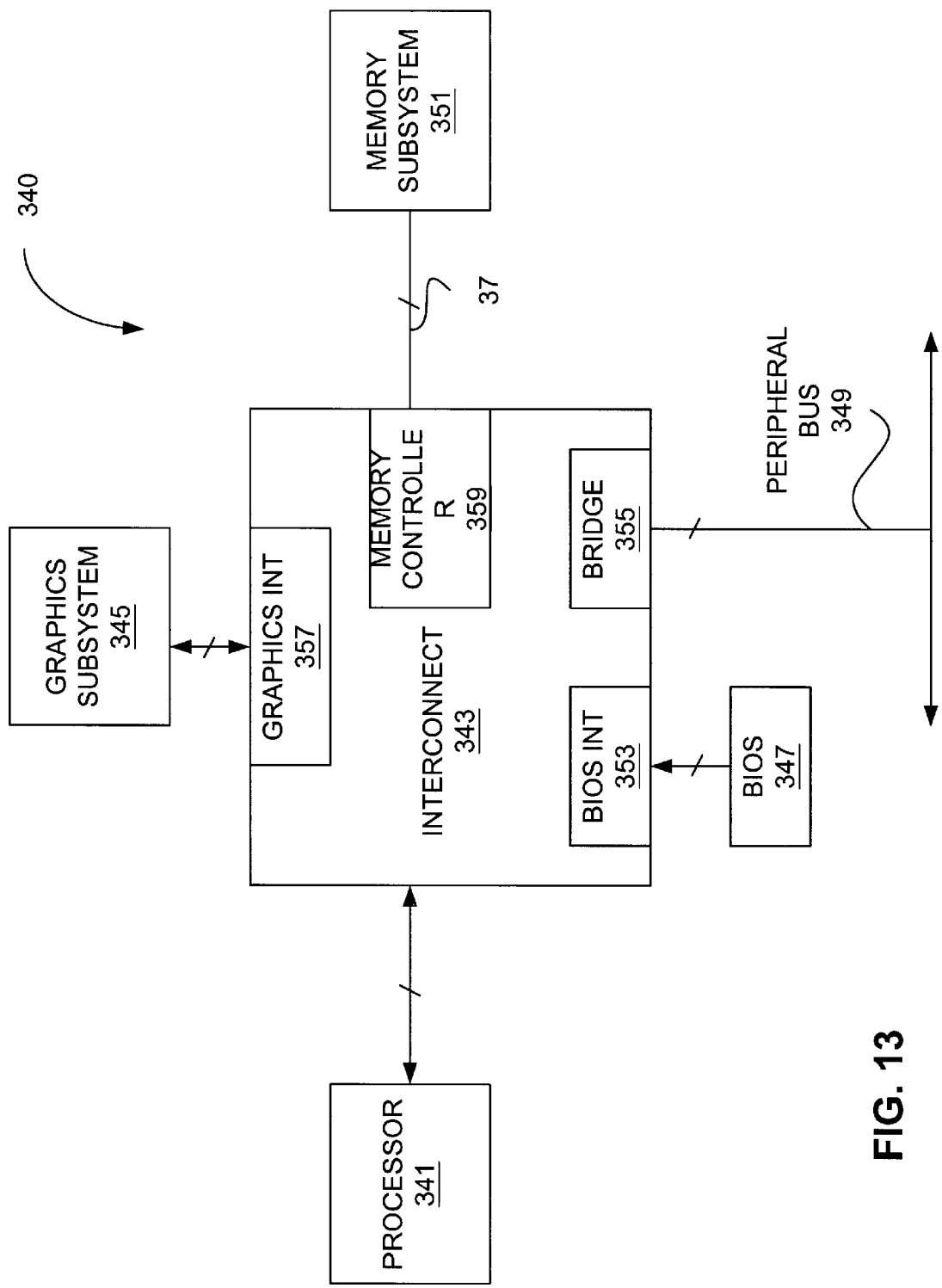
FIG. 13 illustrates an exemplary computer system in which the master-slave system of FIG. 2 may be applied.

FIG. 13 illustrates an exemplary computer system 340 in which the master-slave system of FIG. 2 may be applied. The computer system 340 includes a processor 341, an interconnect device 343, a graphics subsystem 345, a peripheral bus 349, a non-volatile storage 347 containing BIOS instructions (BIOS is an acronym for Basic Input/Output Service and comprises instructions to be carried out by the processor to initialize the computer system and carry out other low level control operations), and a memory subsystem 351. The interconnect device 343 includes control interfaces 357, 353, 355 and 359, respectively, for the graphics subsystem, BIOS, peripheral bus (interface is a bus bridge), and memory subsystem (interface includes a memory controller). In one embodiment, the memory controller 359 and memory subsystem 351 form the master-slave system of FIG. 2. More specifically, the memory subsystem includes a plurality of memory devices coupled to the memory controller via a high-speed signaling path 37. The memory subsystem 351 may include a clock generator for generating the reference clock supplied to the other devices within the master-slave system, or the clock generator may be incorporated into the memory controller 359 or elsewhere in the interconnect device 343.

At system startup, the processor 341 executes initialization routines within the BIOS 347, including routines to direct the memory system timing calibration operations as described above. After the timing calibrations have been performed, the high-speed signaling path 37 may be used for high speed access to the memory devices without requiring timing references to be transmitted in synchronism with the data and control information.

The master-slave system of FIG. 2 may be used in other subsystems of the computer system 340. For example, the peripheral bus 349 may host a master device and one or more slave devices that implement the master-slave system of FIG. 2. Also, the master-slave system of FIG. 2 may be used in other types of processing systems including, without limitation, network processing devices such as routers and switches; workstations; mainframe computing systems; and embedded computer systems such as those found in mobile telephones and other consumer appliances.

Hybrid Single-Clock System

Figure 14:
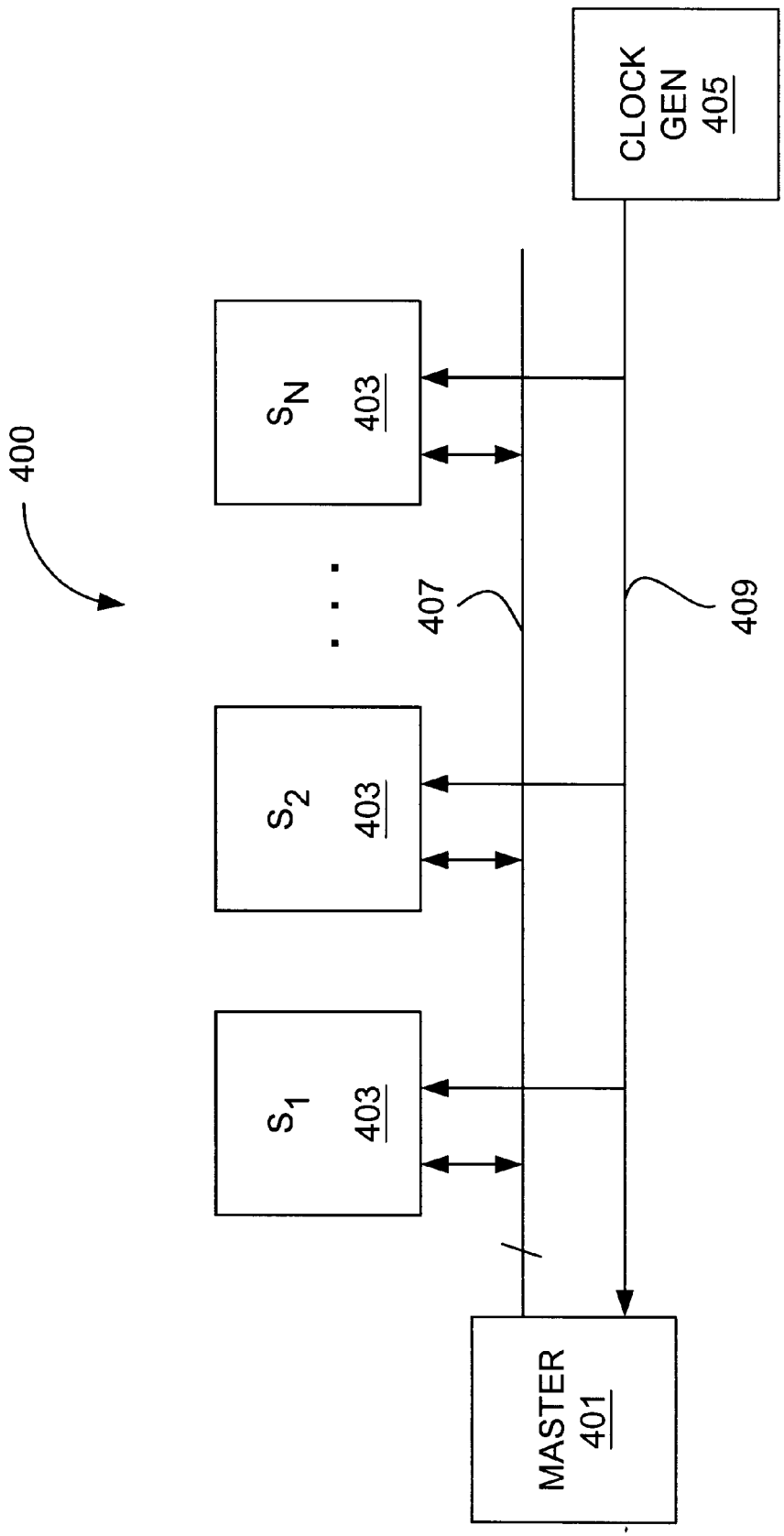
FIG. 14 illustrates an alternative embodiment of a master-slave system.

FIG. 14 illustrates a master-slave system 400 that is an alternative to the master-slave system of FIG. 2. The master-slave system 400 includes a master device 401, slave devices 403 and clock generator 405 generally as described in reference to FIG. 2, but instead of discrete clocklines, a single shared clockline 409 is used to deliver a clock signal from the clock generator 405 to each of the slave devices 403 and the master device 401. One advantage of this configuration is that, because the clock signal propagates toward the master device 401 in parallel with information transmitted on the high-speed signaling path, the clock signal constitutes a source synchronous timing reference for at least one transmission direction on the high-speed signaling path. Thus, by making the electrical length of the segment of the clockline between the master device and a given slave device substantially equal to the electrical length of the segment of the high-speed signaling path between those devices, the need to calibrate slave transmit timing is avoided. That is, instead of performing transmit timing calibration for the slave devices, each of the slave devices may simply generate a transmit clock that is advanced by 90° relative to the externally supplied clock signal (the predetermined phase offset of 90° assumes that two data eyes are transmitted for each cycle of the transmit clock signal—other predetermined phase offsets may be used for other data/clock cycle ratios). In this way, data output by the slave device starting at an edge of the slave's transmit clock signal arrives at the master device in quadrature with the external clock signal (i.e., an edge of CLK travels with the center of the data eye). Slave device receive timing calibration can be performed during system initialization as described above.

In yet another embodiment of the master-slave system of FIG. 14, the clock generator 405 is incorporated into the master device 401 and outputs a clock signal, CLK, that propagates away from the master device on the clockline 409. In such a system, the clock signal, CLK, constitutes a source synchronous timing reference for master-to-slave device transmissions on the high-speed signaling path, avoiding the need for slave receiver calibration. Timing circuitry is preferably provided within each slave device to generate an internal receive clock that lags the clock signal detected on the shared clockline by 90° (the predetermined phase offset of 90° assumes that two data eyes are transmitted for each cycle of the receive clock signal—other predetermined phase offsets may be used for other data/clock cycle ratios). In this way, data output by the master device starting at an edge of CLK is sampled at the center of the data eye upon arrival at the slave device. Slave device transmit timing calibration can be performed during system initialization as described above.

Returning briefly to the master-slave system of FIG. 2, it should be noted that the external clock signal, CLK, serves merely as a frequency reference for generation of clock signals within the master device and slave devices. Accordingly, by using PLLs within the slave devices and master devices to generate internal clock signals that are frequency multiples of CLK, the frequency of CLK may be reduced. More specifically, the frequency of the internal clock signals may be related to the frequency of CLK by the ratio M/N, M and N each being integers. By this arrangement, the frequency of the external clock signal, CLK, may be substantially lower than the frequency at which the master and slave devices communicate over the high-speed signaling path.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory system comprising:
   a signaling path;
   a memory controller coupled to the signaling path;
   a clock generator to generate a first clock signal; and
   a memory device coupled to the signaling path and to the clock generator, the memory device including timing circuitry to generate a second clock signal having a first phase offset, relative to the first clock signal, that is determined at least in part by a signal propagation time on the signaling path, wherein the memory device further includes receive circuitry to receive information from the memory controller via the signaling path under timing control of the second clock signal.

2. The memory system of claim 1 wherein the first phase offset represents a combination of phase offset components including a first component to delay the phase of the second clock signal relative to the first clock signal according to the signal propagation time.

3. The memory system of claim 2 wherein the combination of phase offset components further includes a second component to delay the phase of the second clock signal relative to the first clock signal according to a phase difference between the first clock signal and a third clock signal that is used to time transmission of the information by the memory controller.

4. The memory system of claim 3 further comprising a clockline coupled to the clock generator, the memory controller and the memory device, and wherein the first clock signal is a version of an original clock signal output on the clockline by the clock generator after the original clock signal has propagated on the clockline from the clock generator to the memory device and wherein the third clock signal is a version of the original clock signal after the original clock signal has propagated on the clockline from the clock generator to the memory controller.

5. The memory system of claim 3 further comprising:
   a first integrated circuit that includes the memory controller and the clock generator;
   a second integrated circuit that includes the memory device; and
   a clockline coupled between the memory controller and the memory device, wherein the third clock signal is generated by the clock generator and the first clock signal is a version of the third clock signal after the third clock signal has propagated on the clockline from the memory controller to the memory device.

6. The memory system of claim 5 further comprising a crystal oscillator to output a frequency reference signal to the clock generator, the clock generator generating the third clock signal based on the frequency reference signal.

7. The memory system of claim 2 wherein the timing circuitry within the memory device further generates a third clock signal having a second phase offset, the second phase offset representing a combination of phase offset components that includes a phase offset component to advance the phase of the third clock signal relative to the first clock signal according to the signal propagation time.

8. The memory system of claim 7 wherein the memory device further includes transmit circuitry to transmit information to the memory controller via the signaling path under timing control of the third clock signal.

9. The memory system of claim 2 wherein the combination of phase offset components further includes a second component to advance the phase of the second clock signal relative to the first clock signal according to a setup time of the receive circuitry.

10. The memory system of claim 1 wherein the memory device further includes transmit circuitry to transmit information to the memory controller via the signaling path under timing control of the second clock signal.

11. The memory system of claim 1 wherein the timing circuitry includes a first phase offset register that is programmable to set the first phase offset.

12. The memory system of claim 1 wherein the memory controller and the memory device include calibration control circuitry to communicate a predetermined sequence of bits over the signaling path in a calibration operation to determine the first phase offset.

13. The memory system of claim 1 wherein the memory controller and the memory device each include calibration control circuitry to determine a range of phase offset values over which a test sequence of bits is accurately communicated between the memory device and the memory controller via the signaling path, the first phase offset being selected from within the range of phase offset values.

14. The memory system of claim 13 wherein the first phase offset falls midway between upper and lower bounds of the range of phase offset values.

15. A memory system comprising:
a signaling path;
a memory controller coupled to the signaling path;
a clock generator to generate a first clock signal; and
a memory device coupled to the signaling path and to the clock generator, the memory device including timing circuitry to generate a second clock signal having a first phase offset, relative to the first clock signal, that is determined at least in part by a signal propagations time on the signaling path, wherein the first phase offset represents a combination of phase offset components including a first component to advance the phase of the second clock signal relative to the first clock signal according to the signal propagation time, wherein the memory device further includes transmit circuitry to transmit information to the memory controller via the signaling path under timing control of the second clock signal.

16. The memory system of claim 15 wherein the combination of phase offset components further includes a second component to adjust the phase of the second clock signal relative to the first clock signal according to a phase difference between the first clock signal and a third clock signal that is used to time receipt of the information by the memory controller.

17. The memory system of claim 15 wherein the combination of phase offset components further includes a second component to advance the phase of the second clock signal relative to the first clock signal according to an output delay of the transmit circuitry.

18. A memory system comprising:
a signaling path;
a memory controller coupled to the signaling path;
a clock generator to generate a first clock signal; and
a memory device coupled to the signal path and to the clock generator, the memory device including timing circuitry to generate transmit and receive clock signals having respective phase offsets from the first clock signal according to respective transmit and receive phase offset values within the memory device.

19. The memory system of claim 18 further comprising transmit circuitry to transmit information on the signaling path under timing control of the transmit clock signal and receive circuitry to receive information on the signaling path under timing control of the receive clock signal.

20. The memory system of claim 18 wherein the timing circuitry includes a transmit phase offset register to store the transmit phase offset value and a receive phase offset register to store the receive phase offset value.

21. The memory system of claim 20 wherein the memory controller and the memory device each include timing calibration circuitry to communicate at least one predetermined sequence of bits over the signaling path in a calibration operation to determine the transmit phase offset value and the receive phase offset value.

22. The memory system of claim 21 wherein the timing calibration circuitry within the memory device is configured to update the transmit and phase offset values within the transmit and receive phase offset registers, respectively, during the calibration operation.

23. The memory system of claim 18 wherein the transmit phase offset value represents a combination of phase offset components comprising:
a first phase component to advance the phase of the transmit clock signal relative to the first clock signal according to a propagation time of a signal communicated between the memory controller and the memory device on the signaling path; and
a second phase component to delay the phase of the transmit clock signal relative to the first clock signal according to a phase difference between the first clock signal and a second clock signal that is used to time reception of information on the signaling path by the memory controller.

24. The memory system of claim 23 wherein the receive phase offset value represents a combination of phase offset components comprising:
a third phase component to delay the phase of the receive clock signal relative to the first clock signal according to the propagation time; and
a fourth phase component to delay the phase of the receive clock signal relative to the first clock signal according to the phase difference between the first clock signal and the second clock signal.

25. The memory system of claim 18 wherein the first clock signal has a lower frequency than the transmit and receive clock signals.

26. A semiconductor memory device comprising:
a clock input to receive a first external clock signal; and
timing circuitry including a receive phase offset register and a transmit phase offset register, the timing circuitry being coupled to the clock input to generate receive and transmit clock signals having respective phase offsets from the first external clock signal according to respective phase offset values within the receive and transmit phase offset registers.

27. The memory device of claim 26 further comprising:
a bus interface;
transmit circuitry coupled to the timing circuitry to receive the transmit clock signal therefrom and to the bus interface, the transmit circuitry being configured to transmit information via the bus interface under timing control of the transmit clock signal; and
receive circuitry coupled to the timing circuitry to receive the receive clock signal therefrom and to the bus interface, the receive circuitry being configured to receive information via the bus interface under timing control of the receive clock signal.

28. The memory device of claim 26 wherein the timing circuitry further includes transmit and receive locked-loop circuits to generate the transmit and receive clock signals, respectively, each of the transmit and receive locked-loop circuits having a reference input coupled to the clock input and a phase offset circuit, the phase offset circuit within the transmit locked-loop circuit being coupled to the transmit phase offset register to adjust the phase of the transmit clock signal according to the phase offset value therein, and the phase offset circuit within the receive locked-loop circuit being coupled to the receive phase offset register to adjust the phase of the receive clock signal according to the phase offset value therein.

29. The memory device of claim 28 wherein each of the transmit and receive locked-loop circuits is a delay-locked-loop circuit.

30. The memory device of claim 28 wherein each of the transmit and receive locked-loop circuits is a phase-locked-loop circuit.

31. The memory device of claim 30 wherein each of the transmit and receive phase-locked-loop circuits multiplies the frequency of the first external clock signal such that the receive and transmit clock signals each have a higher frequency than the first external clock signal.

32. The memory device of claim 30 wherein each of the transmit and receive phase-locked-loop circuits multiplies the frequency of the first external clock signal by a ratio M/N, M and N each being integers.

33. The memory device of claim 26 further comprising calibration control circuitry to update the phase offset values within the receive and transmit phase offset registers according to calibration commands received from a memory controller.

34. The memory device of claim 33 further comprising an signaling interface to receive the calibration commands from the memory controller.

35. A memory controller comprising:
a signaling interface to communicate with a memory device; and
calibration control circuitry to communicate with the memory device via the signaling interface in a calibration operation to determine transmit and receive phase offset values that are applied to timing circuitry within the memory device to generate respective transmit and receive clock signals, the transmit phase offset value representing a phase offset between the transmit clock signal and a second clock signal supplied to a clock input of the memory device, and the receive phase offset value representing a phase offset between the receive clock signal and the second clock signal.

36. The memory controller of claim 35 wherein the calibration control circuitry includes circuitry to receive a respective sequence of bits from the memory device for each of a plurality of phase offsets of the transmit clock signal to identify a range of phase offsets within the plurality of phase offsets over which the corresponding received sequences of bits match a test sequence of bits, the transmit phase offset value being selected from within the range of phase offsets.

37. The memory controller of claim 35 wherein the calibration control circuitry includes circuitry to transmit a respective sequence of bits from the memory device for each of a plurality of phase offsets of the receive clock signal to identify a range of phase offsets within the plurality of phase offsets over which the corresponding transmitted sequences of bits, after being received in the memory device, match a test sequence of bits, the receive phase offset value being selected from within the range of phase offsets.

38. A method of communicating information between a memory controller and a memory device, the method comprising:
generating a first clock signal within the memory device, the first clock signal having a phase offset relative to a second clock signal that is determined at least in part by a signal propagation time on a signaling path between the memory device and the memory controller;
timing communication of information between the memory device and the memory controller on the signaling path using the first clock signal, wherein timing communication of information between the memory device and the memory controller comprises transmitting information from the memory device to the memory controller under timing control of the first clock signal;
generating a third clock signal within the memory device, the third clock signal having a phase offset relative to the second clock signal that is determined at least in part by the signal propagation time; and
receiving information from the memory controller within the memory device under timing control of the third clock signal.

39. The method of claim 38 wherein generating a third clock signal comprises generating a third clock signal that leads the first clock signal by a phase offset that is determined at least in part by the signal propagation time.

40. A method of communicating information between a memory controller and a memory device, the method comprising:
generating a first clock signal within the memory device, the first clock signal having a phase offset relative to a second clock signal that is determined at least in part by a signal propagation time on a signaling path between the memory device and the memory controller; and
timing communication of information between the memory device and the memory controller on the signaling path using the first clock signal, wherein generating a first clock signal having a phase offset relative to a second clock signal comprises offsetting the phase of the first clock signal relative to the second clock signal according to value stored in a phase offset register within the memory device.

41. A method of communicating information between a memory controller and a memory device, the method comprising:
generating a first clock signal within the memory device, the first clock signal having a phase offset relative to a second clock signal that is determined at least in part by a signal propagation time on a signaling path between the memory device and the memory controller; and
timing communication of information between the memory device and the memory controller on the signaling path using the first clock signal, wherein timing communication of information between the memory device and the memory controller comprises receiving information from the memory controller within the memory device under timing control of the first clock signal.

42. A method of communicating information between a memory controller and a memory device, the method comprising:
generating, within the memory device, transmit and receive clock signals that have respective phase offsets from a reference clock signal according to values stored in respective transmit and receive phase offset registers within the memory device;
transmitting information from the memory device to the memory controller in response to transitions of the transmit clock signal; and
receiving information from the memory controller in the memory device in response to transitions of the receive clock signal.

43. The method of claim 42 further comprising communicating at least one predetermined sequence of bits between the memory controller and the memory device in a calibration operation to set the respective values in the transmit and receive phase offset registers.

44. The method of claim 42 wherein generating the transmit and receive clock signals comprises generating transmit and receive clocks that have a higher frequency than the reference clock signal.

45. A method of operation within a semiconductor memory device, the method comprising:

generating transmit and receive clock signals that have respective phase offsets from a reference clock signal according to values stored in respective transmit and receive phase offset registers within the memory device;

transmitting information via an external signal path in response to transitions of the transmit clock signal; and receiving information via the external signal path in response to transitions of the receive clock signal.

46. The method of claim 45 further comprising transmitting a predetermined sequence of bits to a memory controller via the external signal path in a calibration operation to set the value stored in the transmit phase offset register.

47. The method of claim 45 further comprising receiving a predetermined sequence of bits from a memory controller via the external signal path in a calibration operation to set the value stored in the receive phase offset register.

48. The method of claim 45 wherein generating the transmit and receive clock signals comprises generating transmit and receive clocks that have a higher frequency than the reference clock signal.

49. A method of controlling a semiconductor memory device within a memory system, the method comprising:

communicating with the memory device in a calibration operation to determine a transmit phase offset value that is applied to timing circuitry within the memory device to generate a transmit clock signal, the transmit phase offset value representing a phase offset between the transmit clock signal and a second clock signal supplied to a clock input of the memory device; and communicating with the memory device in a calibration operation to determine a receive phase offset value that is applied to timing circuitry within the memory device to generate a receive clock signal, the receive phase offset value representing a phase offset between the receive clock signal and the second clock signal.

50. The method of claim 49 wherein communicating with the memory device in a calibration operation to determine a transmit phase offset value comprises:

receiving a respective sequence of bits from the memory device for each of a plurality of phase offsets of the transmit clock signal to identify a range of phase offsets within the plurality of phase offsets over which the corresponding received sequences of bits match a test sequence of bits; and selecting the transmit phase offset value from within the range of phase offsets.

51. The method of claim 49 wherein communicating with the memory device in a calibration operation to determine a receive phase offset value comprises:

transmitting a respective sequence of bits to the memory device for each of a plurality of phase offsets of the receive clock signal to identify a range of phase offsets within the plurality of phase offsets over which the corresponding transmitted sequences of bits, after being received in the memory device, match a test sequence of bits; and selecting the receive phase offset value from within the range of phase offsets.

* * * * *